(12) United States Patent
Kuang et al.

(10) Patent No.: US 7,276,932 B2
(45) Date of Patent: Oct. 2, 2007

(54) POWER-GATING CELL FOR VIRTUAL POWER RAIL CONTROL

(75) Inventors: Jente B. Kuang, Austin, TX (US); Jethro C. Law, Cedar Park, TX (US); Hung C. Ngo, Austin, TX (US); Kevin J. Nowka, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 468 days.

(21) Appl. No.: 10/926,597

(22) Filed: Aug. 26, 2004

(65) Prior Publication Data

US 2006/0055391 A1    Mar. 16, 2006

(51) Int. Cl.
   *H03K 19/23*     (2006.01)
(52) U.S. Cl. .................. 326/33; 326/83; 326/93; 326/35
(58) Field of Classification Search .................. 326/33, 326/83
   See application file for complete search history.

(56) References Cited

U.S. PATENT DOCUMENTS 6,140,836 A * 10/2000 Fujii et al. ................... 326/35
7,164,291 B2 * 1/2007 Mair et al. ................... 326/83
2003/0184364 A1 * 10/2003 Miyagi ...................... 327/544
2004/0080340 A1 * 4/2004 Hidaka ........................ 326/83

\* cited by examiner

Primary Examiner—Vibol Tan
(74) Attorney, Agent, or Firm—Winstead PC

(57) ABSTRACT

Virtual power-gated cells (VPC) are configured with control circuitry for buffering control signals and a power-gated block (PGB) comprising two or more NFETs for virtual ground rail nodes and PFETs for virtual positive rail nodes. Each VPC has a control voltage input, a control voltage output, a node coupled to a power supply voltage potential, and a virtual power-gated node that is coupled and decoupled from the power supply potential in response to logic states on the control input. The control signals are buffered by non-power-gated inverters before being applied to the input of a PGB. VPCs may propagate a control signal that is in phase with or inverted from a corresponding control signal at the control input. VPCs may be cascaded to create virtual power rails in chains and power grids. The control signals are latched at the cell boundaries or latched in response to a clock signal.

16 Claims, 21 Drawing Sheets

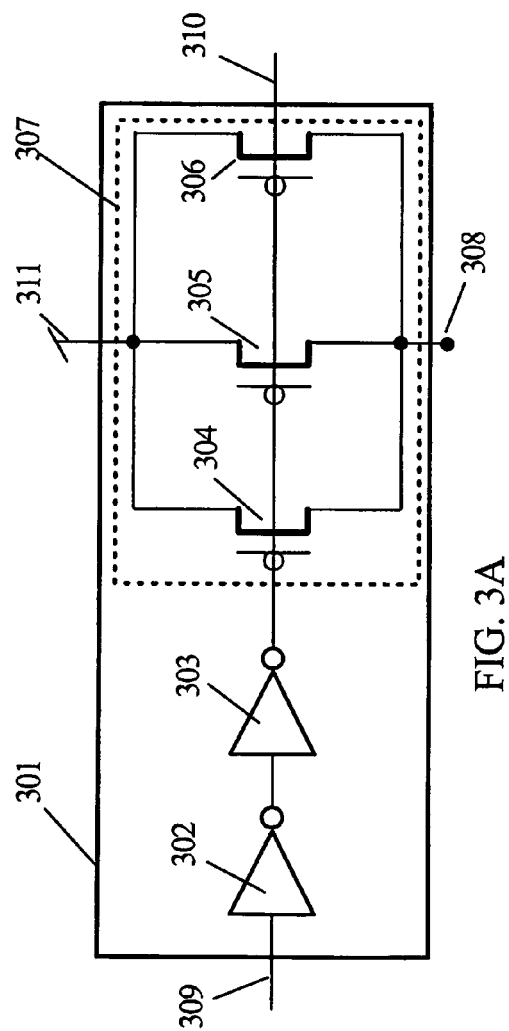
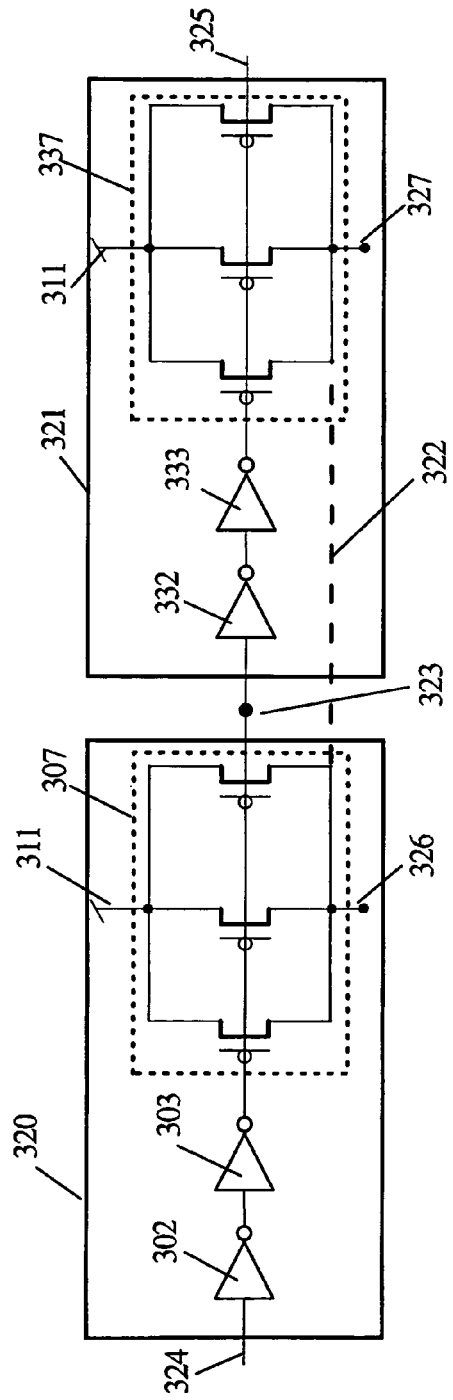
FIG. 3A
FIG. 3B

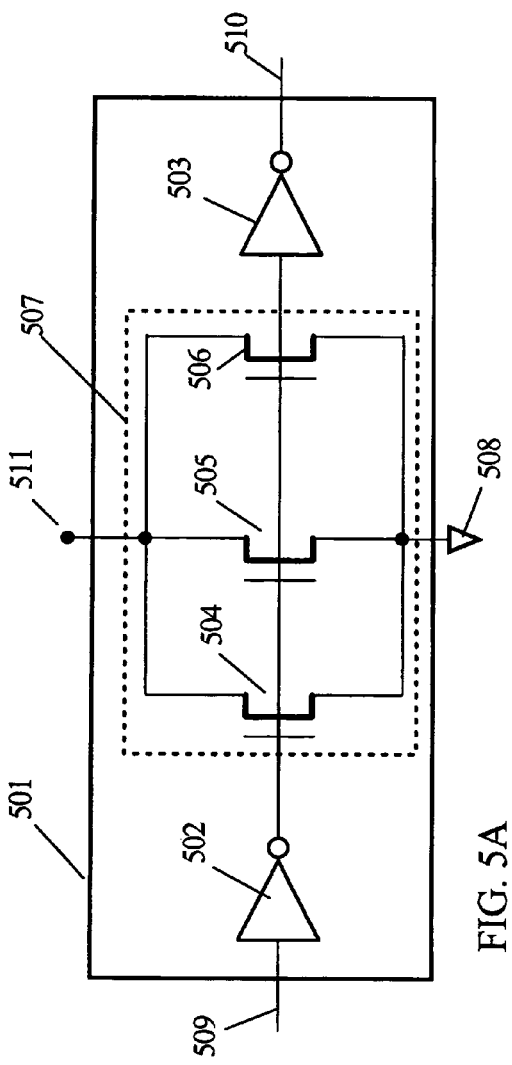
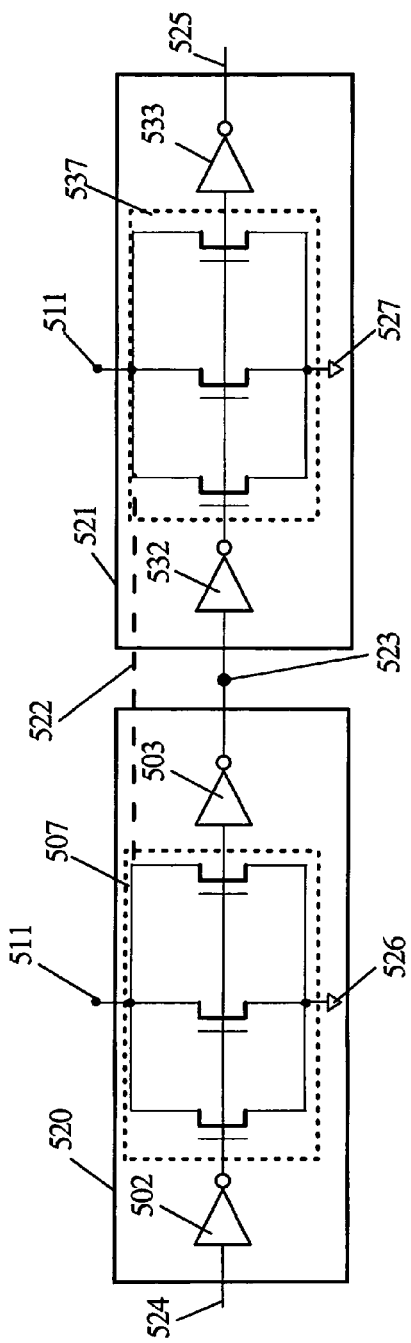
FIG. 5A
FIG. 5B

POWER-GATING CELL FOR VIRTUAL POWER RAIL CONTROL

GOVERNMENT RIGHTS

This invention was made with Government support under NBCH30390004, BGR W0132280 awarded by PERCS II. The Government has certain rights in this invention.

CROSS-REFERENCE TO RELATED APPLICATIONS

The present invention is related to U.S. patent application Ser. No. 10/821,047, filed Apr. 8, 2004, now U.S. Pat. No. 7,046,063, entitled "AN INTERFACE CIRCUIT FOR COUPLING BETWEEN LOGIC CIRCUIT DOMAINS,"

U.S. patent application Ser. No. 10/821,048, filed Apr. 8, 2004, now U.S. Pat. No. 6,975,134, entitled "BUFFER/DRIVER CIRCUITs," and U.S. patent application Ser. No. 10/835,501 filed Apr. 29, 2004, entitled "SELF LIMITING GATE LEAKAGE DRIVER," which are incorporated by reference herein.

TECHNICAL FIELD

The present invention relates in general to complementary metal oxide semiconductor (CMOS) circuits and, in particular, to circuit methodologies for implementing power-gating to control power and leakage.

BACKGROUND INFORMATION

Oxide tunneling current in metal oxide silicon (MOS) field effect transistors (FET) is a non-negligible component of power consumption as gate oxides get thinner, and may in the future become the dominant leakage mechanism in sub-100 nm complementary MOS (CMOS) circuits. The gate current is dependent on various conditions for a single transistor and three main static regions of operation may be identified for a MOSFET. The amount of gate-leakage current differs by several orders of magnitude from one region to another. Whether a transistor leaks significantly or not is also affected by its position in relation to other transistors within a CMOS circuit structure as this affects the voltage stress to which a particular device is subjected.

The three regions of operation are a function of applied bias if one only considers the parameters that affect the magnitude of gate current in a MOSFET as it operates in relation to other MOSFETs. Assuming that the supply voltage (Vdd) and the threshold voltage (Vt) are fixed, then a MOSFET in a static CMOS logic gate operates in one to the three regions, each with a significantly different amount of gate leakage.

The first region is called "strong inversion" and is the region where a MOSFET operates with the absolute value of the gate to source voltage (|VGS|) equal to Vdd. The gate-leakage current density for an N-channel FET (NFET) in strong inversion may be as high as $10^3$ amperes square centimeter ($A/cm^2$) for an oxide thickness of 1.5 nanometers (nm) at Vdd equal to 3 volts (V). For such a thin oxide, a more realistic value for Vdd is 1.2 V, in which case the gate-leakage current would more likely be 20 $A/cm^2$.

The second region is called the "threshold" region where |VGS|=Vt. A MOSFET operating in the threshold region will leak significantly less than one operating in the strong inversion region, typically 3 to 6 orders of magnitude less depending on Vdd and the oxide thickness.

The third region is called the "Off" region where |VGS|=0.0 V. For an NFET operating in the Off region, there is no leakage if the drain voltage (Vd)=0.0 V. However, if Vd is equal to Vdd, then a small leakage current in the reverse direction (drain to gate) may be present due to gate-drain overlap area. Of course this current depends on transistor geometry and is typically 10 orders of magnitude less than the gate-leakage current in the strong inversion region.

The above three regions represent three distinct conditions or states for the channel of a MOSFET. Whether an "ON" transistor operates at strong inversion or at threshold is determined by its position inside a logic circuit structure as well as by the state of other transistors in the circuit structure.

Both NFETs and P-channel FETs (PFETs) in a logic circuit structure operate in one of the three regions described above. However, the main tunneling current in a PFET device in strong inversion is due to hole tunneling from the valence band and the main tunneling current in an NFET device in strong inversion is due to electron tunneling from the conduction band. Because of this, PFET gate currents are about 10 times smaller than equivalent sized NFET devices. This fact is important in assessing gate-leakage in a static CMOS circuit.

Since gate leakage currents are measured as current density, it follows that the gate-leakage current in a MOSFET is directly proportional to the gate area (width times length). Transistor sizing, therefore, has a direct impact on the amount of gate-leakage in a CMOS logic circuit.

As CMOS circuits become smaller, leakage current that results when voltage is applied to the gate of the field effect transistors becomes a significant portion of the power dissipation. Leakage power may become the limiting factor in how small devices may be manufactured. As devices are made smaller, the power supply voltage is correspondingly reduced. However, this may not achieve an adequate reduction in leakage power dissipation. Alternate techniques are being employed to reduce leakage power. One popular technique is to use power-gating to isolate the power supply voltage in groups of circuits at controlled times. These circuits are sometimes referred to as being part of a power-gated domain. Other circuits may be evaluating a logic function and may not be in a power-gated domain. Interfacing between circuits in a power-gated domain and circuits in a non-power-gated domain may prove difficult. The state of an output from a power-gated domain may be uncertain during the time period of power-gating. While the benefits of power-gating are known, there is no consensus on strategies to preserve logic states of outputs in the power-gated domains. Since power-gated domains may be variable, the method of preserving output logic states from circuits in a power-gated domain are controlled by the power-gating control signals themselves.

The current drive capability of a CMOS buffer depends on the channel size of devices used to drive outputs or to drive many other logic gate inputs. Therefore, one would expect the large devices to exhibit large gate-leakage current when the technology has gate oxides that are very thin. Likewise, logic regions with a high number of logic gates may exhibit a large gate-leakage current due to the large number of devices that are in strong inversion at any one static time (between clock transitions). Logic regions with a high number of logic gates may employ power supply gating whereby the power to the logic devices are decoupled by the action MOSFETs, PFETs for the positive power supply voltage and NFETs for the negative power supply voltage. These regions where power supply gating is employed is sometimes referred to as "cuttable" regions. When a cuttable region is interfaced with a non-cuttable region, then logic states at the interface outputs may become indeterminate when power is decoupled.

While employing cuttable regions enables the leakage in an integrated circuit to be managed, controlling these regions may lead to significant overhead and present problems in implementing the cuttable regions. It would be desirable to have a method and scalable circuits modules or cells from which a designer could design the power distribution and control of the power-gated regions using virtual power supply rails that have control circuitry integrated within the virtual rail cells. This would allow the designer to customize power-gating using virtual rails in a systematic and defined fashion.

There is, therefore, a need for a header and footer circuit design methodology as well a cell based virtual rail cells that make it simpler to implement power-gating of logic systems and sub-systems.

SUMMARY OF THE INVENTION

The power-gating circuit used to selectively couple the positive supply voltage to and from selected logic gates is referred to as "a header circuit" and power-gating circuit used to selectively couple the ground supply voltage to and from selected logic gates is referred to as "a footer circuit." In embodiments of the present invention, the header and footer circuits are configured into cells that contain both the control circuitry and the switch device(s) used to actually couple the power supply voltage potential from the corresponding power supply rail to the power-gated logic. The cells are configured with a control input, a node coupled to a power supply voltage potential, a node for coupling to selective power-gated logic, and an output for propagating the control to another cell. In one embodiment the cells have non-inverting control with the cell control input and output having the same steady state phase. In another embodiment, the cell control input and output have the opposite steady state phase. The cell control has at least one or more series coupled inverting logic gates for receiving the cell control input and generating the cell control output. Multiple power-gating switch devices are used to couple the power supply potential to the power-gated logic node wherein the gates controlling the electronic switches are coupled in parallel to an output of one of the inverting logic gates in the cell control path. Control signals propagate from the cell control input through the inverting logic gates to the power-gating switches to the cell control output. The cell control inverting logic gates may all be placed on the input side of the power-gating switches or split so that the cell control signal that turns the power-gating switches ON and OFF has an opposite steady state phase from the cell control output. Embodiments of the present invention allow a designer to employ the cells in a variety of ways to implement power-gating to control power and leakage current. This cell based approach effectively eliminates the drive delay penalty due to long wires required to couple control signals in a non-cell based approach.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A is a circuit block diagram illustrating a virtual positive voltage rail cell configured according to embodiments of the present invention;

FIG. 3B is a circuit block diagram illustrating cascading two virtual positive voltage rail cells according to embodiments of the present invention;

FIG. 5A is a circuit block diagram illustrating another virtual ground rail cell configured according to embodiments of the present invention;

FIG. 5B is a circuit block diagram illustrating cascading two virtual ground voltage rail cells according to another embodiment of the present invention;

DETAILED DESCRIPTION

Figure 1:
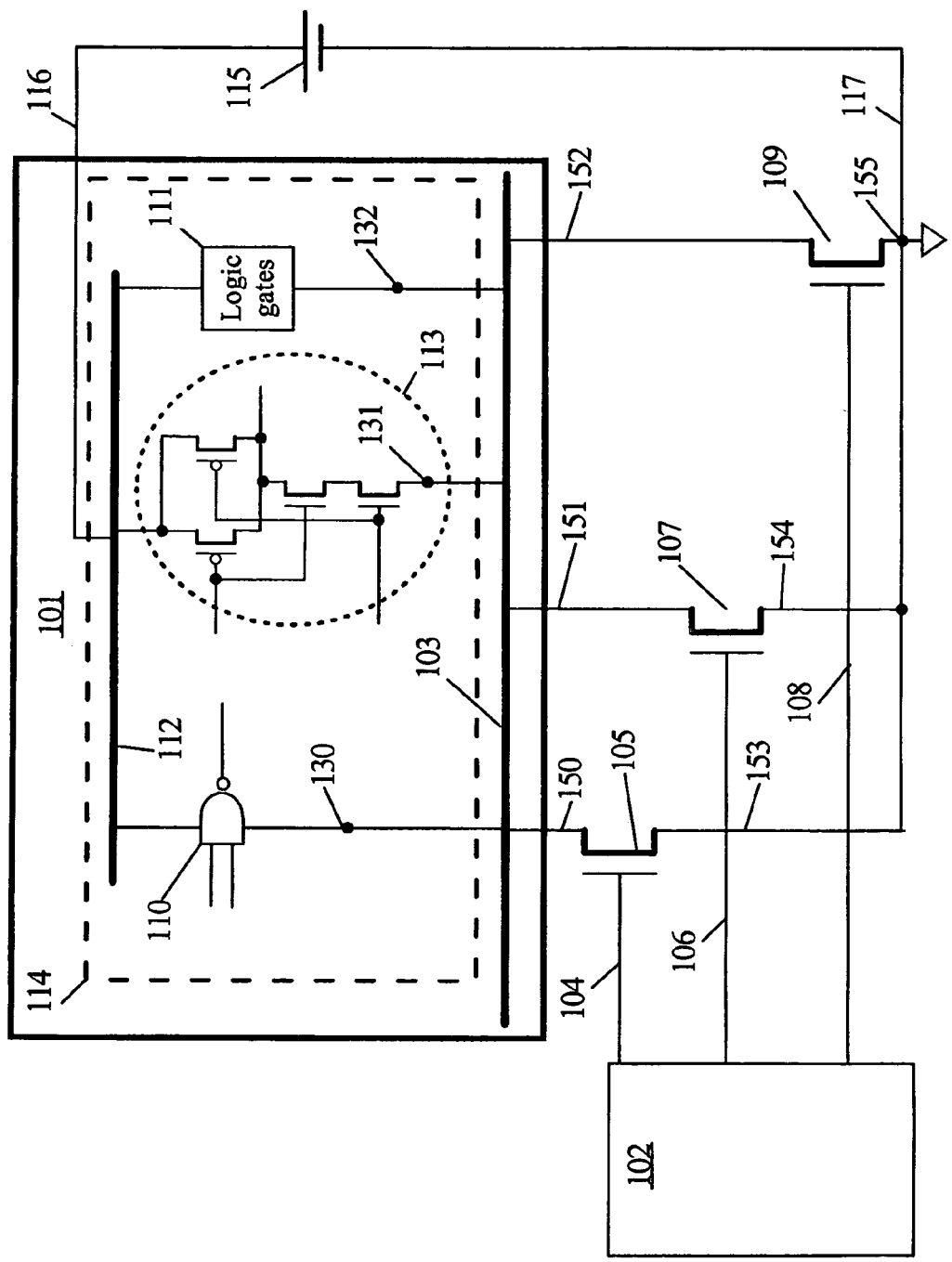
FIG. 1 is a circuit block diagram illustrating a basic topology of embodiments of the present invention for power-gating a virtual ground rail.

In the following description, numerous specific details are set forth to provide a thorough understanding of the present invention. However, it will be obvious to those skilled in the art that the present invention may be practiced without such specific details. In other instances, well-known circuits may be shown in block diagram form in order not to obscure the present invention in unnecessary detail. For the most part, details concerning timing, and the like have been omitted inasmuch as such details are not necessary to obtain a complete understanding of the present invention and are within the skills of persons of ordinary skill in the relevant art.

In the following, power supply voltage potentials are distributed to circuits on circuit traces or printed wires which may be referred to interchangeably as power supply rails, grids or buses. Power supply voltage potentials are coupled to the buses or grids to activate various logic circuitry. The power supply voltage potentials may be referred to simply as positive potential or ground potential. The "voltage" term may be dropped for simplicity with the understanding that all the potentials are voltage potentials. Embodiments of the present invention employ power-gating circuitry to configure cells for generating virtual power supply rails where the switching devices for coupling and decoupling the virtual power supply rails from the power supply potentials are integrated with the control logic devices for driving the switching devices. These may be referred to as power-gating cells or virtual rail cells.

Refer now to the drawings wherein depicted elements are not necessarily shown to scale and wherein like or similar elements are designated by the same reference numeral through the several views.

FIG. 1 is a block circuit diagram of power-gating according to embodiments of the present invention. A logic circuit domain 101 has a virtual low (ground) power supply rail or bus (VGR) 103 that is coupled to the ground nodes 130-132 of selected circuits 110, 111, and 113 in domain 101. Logic circuit 113 illustrates the FETs making up its logic function. Power supply 115 has positive voltage potential 116 coupled directly to bus 112 and ground voltage potential 117. The VGR 103 is selectively coupled to the power supply ground voltage potential 117 with parallel N channel field effect transistor (NFET) devices 105, 107, and 109 operating as electronic switches. NFETs 105, 107, and 109 have nodes 150-152, respectively, coupled to VGR 103 and nodes 153-154, respectively, coupled to ground voltage potential 117. The NFETs 105, 107, and 109 are controlled by logic signals 104, 106, and 108, respectively. Logic signals 104, 106, and 108 are generated in logic domain 102 with non power-gated circuitry. In this manner, VGR 103 may be coupled to ground potential 117 with various degrees of conductivity. Large devices have higher conductivity but generally display higher leakage. Smaller devices have lower conductivity but display lower leakage. In this manner, some or all of NFETs 105, 107, and 109 may be gated ON when there is a high degree of switching in domain 101 requiring speed in arriving at a logic output in response to logic inputs. Once an output is determined in domain 101, selective ones of NFETs 105, 107, and 109 may be gated OFF thus reducing leakage power.

Figure 2:
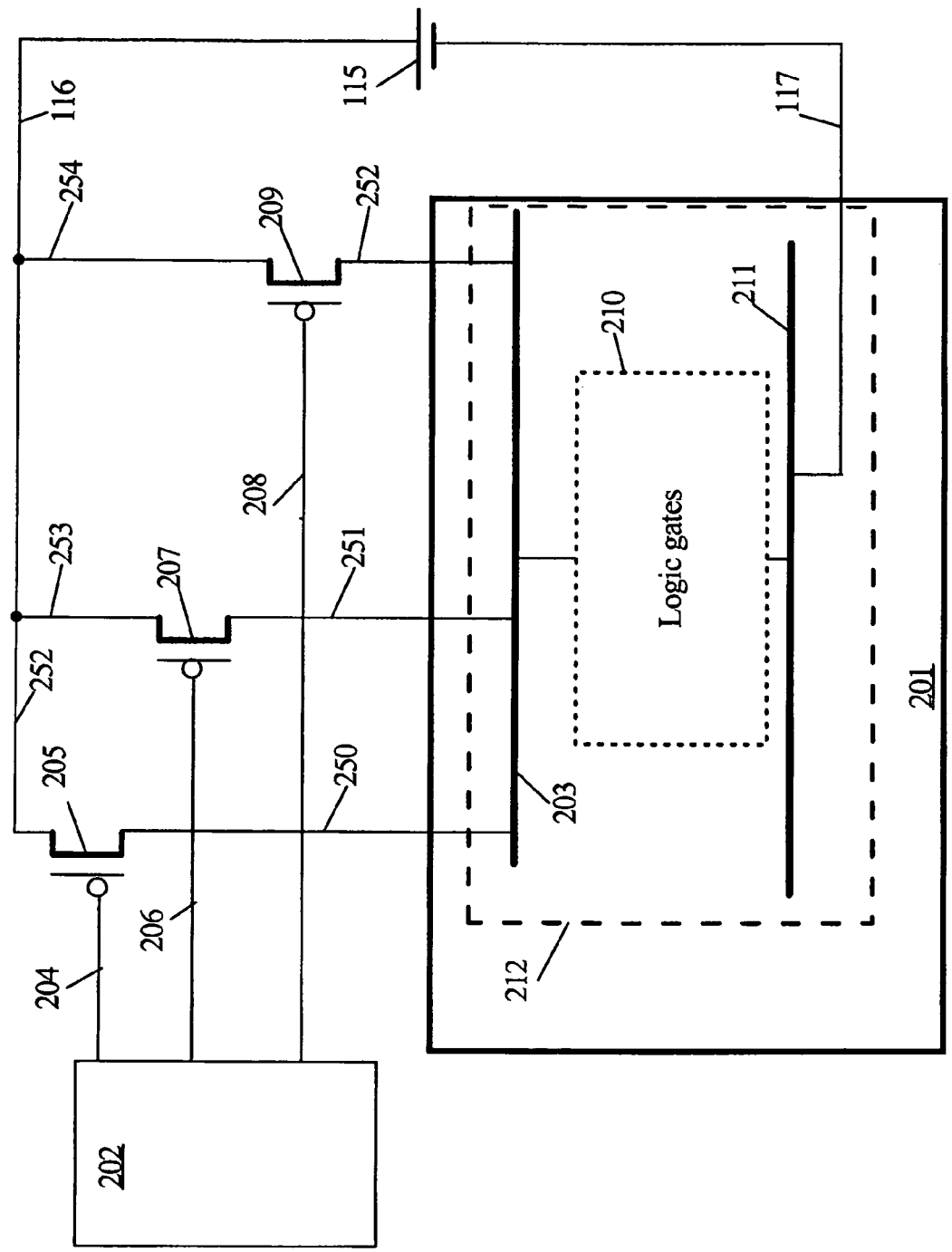
FIG. 2 is a circuit block diagram illustrating a basic topology of embodiments of the present invention for power-gating a virtual positive voltage rail.

FIG. 2 is a block circuit diagram of power-gating according to embodiments of the present invention. A logic circuit domain 201 has a virtual high (positive) power supply rail or bus (VPR) 203 that is coupled to a positive power bus in selected circuits 210. Power bus 211 of logic gates 210 is coupled directly to ground potential 117 of power supply 115. VPR 203 is coupled to the positive potential 116 of power supply with parallel P channel field effect transistor (PFET) devices 205, 207, and 209 operating as electronic switches. PFETs 205, 207, and 209 have nodes 252-254, respectively, coupled to positive voltage potential 116 and nodes 250-251, respectively, coupled to VPR 203. The PFETs 205, 207, and 209 are gated by logic signals 204, 206, and 208, respectively. Logic signals 204, 206, and 208 are generated in logic domain 202 with non-power-gated circuitry. In this manner, VPR 203 may be coupled to the positive potential 116 with various degrees of conductivity. Large devices have higher conductivity but display higher leakage. Smaller devices have lower conductivity but display lower leakage. Some or all of PFETs 205, 207, and 209 may be gated ON when there is a high degree of switching in domain 201 requiring speed in arriving at a logic output in response to logic inputs. Once an output is determined in domain 201, selective ones of PFETs 205, 207, and 209 may be gated OFF thus reducing leakage power.

FIGS. 1 and 2 show partitioned power-gating applied to only one power supply potential at a time, however, it is understood that embodiments of the present invention may employ partitioned power-gating simultaneously to both power supply potentials for logic circuits in a logic domain (e.g., domain 201).

The following FIGS. 3-19 may show embodiments of the present invention applied to one power supply bus at a time for simplicity. Likewise, NFETs and PFETs are used as electronic switches to couple power supply potentials to virtual power buses. These NFETs and PFETs have nodes that may not have specific designators as used in FIGS. 1 and 2 for simplicity of the drawings.

FIG. 3A is a circuit diagram of a virtual positive voltage rail cell (VPRC) 301 according to an embodiment of the present invention. VPRC 301 has a power-gating block (PGB) 307 and non-power-gated inverters 302 and 303. VPRC 301 has a Vdd control input 309 coupled to logic inverter 302. Logic inverter 302 is coupled to logic inverter 303 an generates positive voltage potential (Vdd) control output 310 which is also coupled to the gates of PFETs 304-306. PFETs 304-306 are the devices that couple and decouple the positive voltage potential (Vdd) 311 to the virtual positive voltage rail node (VPR) 308 in response to logic states on Vdd control output 310. PFETs 304-306 form PGB 307. Typically a PGB is made up of two or more small transistor devices in parallel that act as one large device relative to their conductivity, however, the gates of these devices may be coupled over a wiring length wherein there is a delay from when PFET 304, PFET 304, and PFET 306 turn ON and OFF. While only three devices are shown in PGB 307, in general, PGB 307 may have many devices depending on the how much logic circuitry is power-gated with VPR 308. Three devices are shown only to simplify the circuit diagrams. Vdd control output 310 extends from VPRC 301 so that multiple VPRCs may be cascaded to form multiple VPR nodes as is shown in FIG. 3B. This cell based power-gating used in embodiments of the present invention effectively eliminates the drive delay penalty due to long wires required to couple control signals in a non-cell based approach to power-gating.

FIG. 3B illustrates a VPRC 320 cascaded with a VPRC 321. Vdd control input 324 is coupled to non-power-gated logic inverters 302 and 303 which in turn drive the gates of the PFETs in PGB 307. The Vdd control output of VPRC 320 and the Vdd control input of VPRC 321 are coupled at node 323. In this manner Vdd control input 324 and Vdd control output 325 have the same steady state phase but there is a delay time period for a transition on Vdd control input 324 to propagate through the logic inverters (302, 303, 332, and 333) and the PGBs (307 and 337) in VPRC 320 and 321. The VPR 326 and VPR 327 nodes may be segmented or they may be coupled together as illustrated by dotted line 322. When Vdd control input 324 transitions to a logic zero the PFETs (e.g., 304-306) in PGB 307 in VPRC 320 turn ON first in delay sequence. When the transition to a logic zero propagates through to PGB 337 in VPRC 321, then the VPR 327 node in VPRC 321 is also coupled to Vdd 311 by PGB 337 but a delay time period following the turn ON of the PFETs in PGB 307 in VPRC 320. In this manner, a designer may time the "sleep" and "wake-up" of a VPR node powering logic devices by selecting which VPR (e.g., 326 or 327) in a sequence of VPRCs is selected for power-gating selected logic circuitry.

Figure 4A:
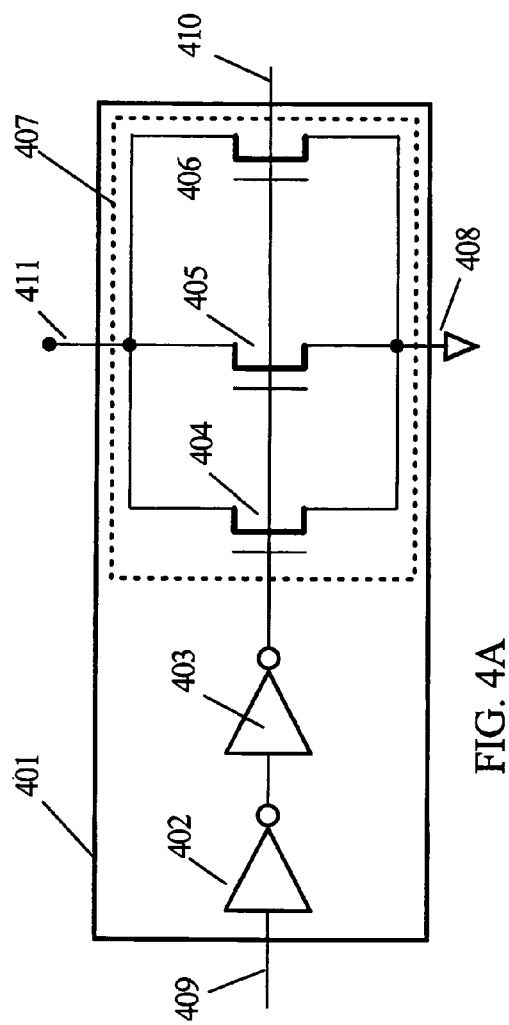
FIG. 4A is a circuit block diagram illustrating a virtual ground rail cell configured according to embodiments of the present invention.

FIG. 4A is a circuit diagram of a virtual ground voltage rail cell (VGRC) 401 according to an embodiment of the present invention. VGRC 401 has a power-gating block (PGB) 407 and non-power-gated inverters 402 and 403. VGRC 401 has a Vgnd control input 409 coupled to logic inverter 402. Logic inverter 402 is coupled to logic inverter 403 an generates ground voltage potential (Vgnd) control output 410 which is also coupled to the gates of NFETs 404-406. NFETs 404-406 are the devices that couple and decouple the ground voltage potential (Vgnd) 411 to the virtual ground voltage rail node (VGR) 408 in response to logic states on Vgnd control output 410. NFETs 404-406 form PGB 407. Typically a PGB is made up of two or more small transistor devices in parallel that act as one large device relative to their conductivity, however, the gates of these devices may be coupled over a wiring length wherein there is a delay from when NFET 404, NFET 404, and NFET 406 turn ON and OFF. While only three devices are shown in PGB 407, in general, PGB 407 may have many devices depending on the how much Logic circuitry is power-gated with VGR 408. Three devices are shown only to simplify the circuit diagrams. Vgnd control output 410 extends from VGRC 401 so that multiple VGRCs may be cascaded to form multiple VGR nodes as is shown in FIG. 4B.

Figure 4B:
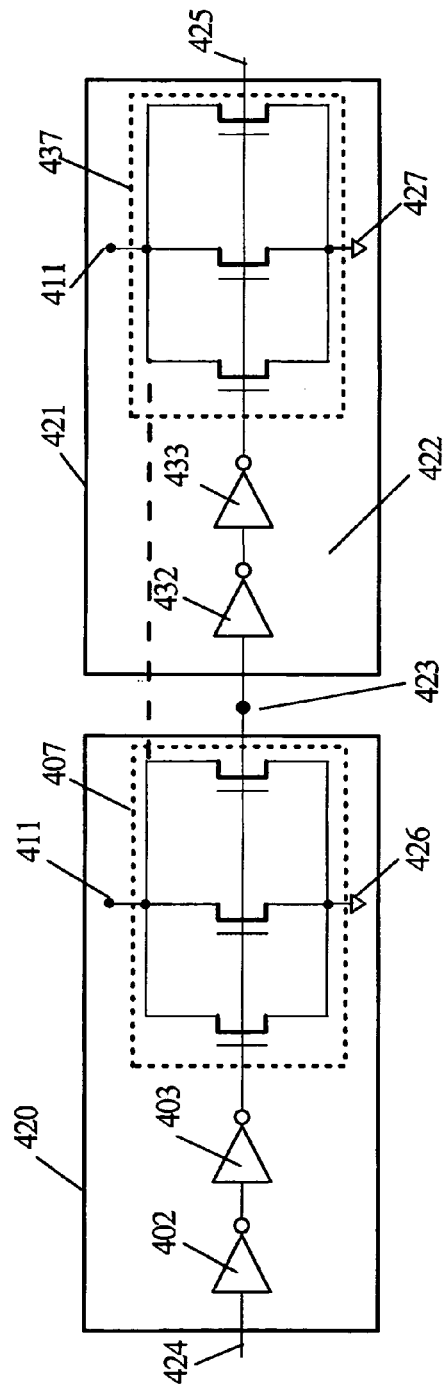
FIG. 4B is a circuit block diagram illustrating cascading two virtual ground voltage rail cells according to embodiments of the present invention.

FIG. 4B illustrates a VGRC 420 cascaded with a VGRC 421. Vgnd control input 424 is coupled to non-power-gated logic inverters 402 and 403 which in turn drive the gates of the NFETs in PGB 407. The Vgnd control output of VGRC 420 and the Vgnd control input of VGRC 421 are coupled at node 423. In this manner Vgnd control input 424 and Vgnd control output 425 have the same steady state phase but there is a delay time period for a transition on Vgnd control input 424 to propagate through the logic inverters (402 and 403) and PGB 407 and 437 in both VGRC 420 and 421 respectively. Nodes VGR 426 and VGR 427 may be segmented or they may be coupled together as illustrated by dotted line 422. When Vgnd control input 424 transitions to a logic zero the NFETs (e.g., 404-406) in PGB 407 in VGRC 420 turn ON first in delay sequence. When the transition to a logic zero propagates through to PGB 437 in VGRC 421, then VGR 427 node in VGRC 421 is also coupled to Vgnd 411 by PGB 437 but a delay time period following the turn ON of the NFETs (e.g., 404-406) of PGB 407 in VGRC 420. In this manner, a designer may time the "sleep" and "wake-up" of a VGR node powering logic devices by selecting which VGR (e.g., 426 or 427) in a sequence of VGRCs is selected for power-gating selected logic circuitry.

FIG. 5A is a circuit diagram of another virtual ground voltage rail cell (VGRC) 501 according to an embodiment of the present invention. VGRC 501 has a power-gating block (PGB) 507 and non-power-gated inverters 502 and 503. Inverters 502 and 503 are not coupled directly in series as was the case in VGRC 420 in FIG. 4A. VGRC 501 has a Vgnd control input 509 coupled to logic inverter 502. Logic inverter 502 is coupled to the gates of NFETs 504-506 and then to logic inverter 503 which generates Vgnd control output 510. NFETs 504-506 are the devices that couple and decouple Vgnd 511 to the virtual ground voltage rail node (VGR) 508 in response to logic states on Vgnd control output 510. NFETs 504-506 form PGB 501. In this embodiment, a logic one turns ON the NFET devices in PGB 507 as Vgnd control input 509 has only one logic inversion before it is coupled to the NFETs in PGB 507. Again Vgnd control output 510 extends from VGRC 501 so that multiple VGRCs may be cascaded to form multiple VGR nodes as is shown in FIG. 5B.

FIG. 5B illustrates a VGRC 520 cascaded with a VGRC 521 according to the embodiment of VGRC 501 of FIG. 5A. Vgnd control input 524 is coupled to non-power-gated logic inverter 502 and its output in turn drives the gates of the NFETs in PGB 507. The gates of the NFETs in PGB 507 are also coupled to the input of non-power-gated inverter 503 which converts the Vgnd control output of VGRC 520 to the same steady state phase as Vgnd control input 524. The Vgnd control output of VGRC 520 and the Vgnd control input of VGRC 521 are coupled at node 523. In this manner Vgnd control input 524 and Vgnd control output 525 have the same steady state phase but again there is a delay time period for a transition on Vgnd control input 524 to propagate through the logic inverters (502 and 503) and PGB 507 and 537 in both VGRC 520 and 521 respectively. Nodes VGR 526 and VGR 527 may be segmented or they may be coupled together as illustrated by dotted line 522. When Vgnd control input 524 transitions to a logic zero the NFETs (e.g., 504-506) in PGB 507 in VGRC 520 turn ON first in delay sequence. When the transition to a logic zero propagates as a logic one to PGB 537 in VGRC 521, then VGR 527 is also coupled to Vgnd 511 by PGB 537 but a delay time period following the turn ON of the NFETs (e.g., 504-506) of PGB 507 in VGRC 520. In this manner, a designer may time the "sleep" and "wake-up" of a VGR node powering logic devices by selecting which VGR (e.g., 526 or 527) in a sequence of VGRCs is selected for power-gating selected logic circuitry.

Figure 6A:
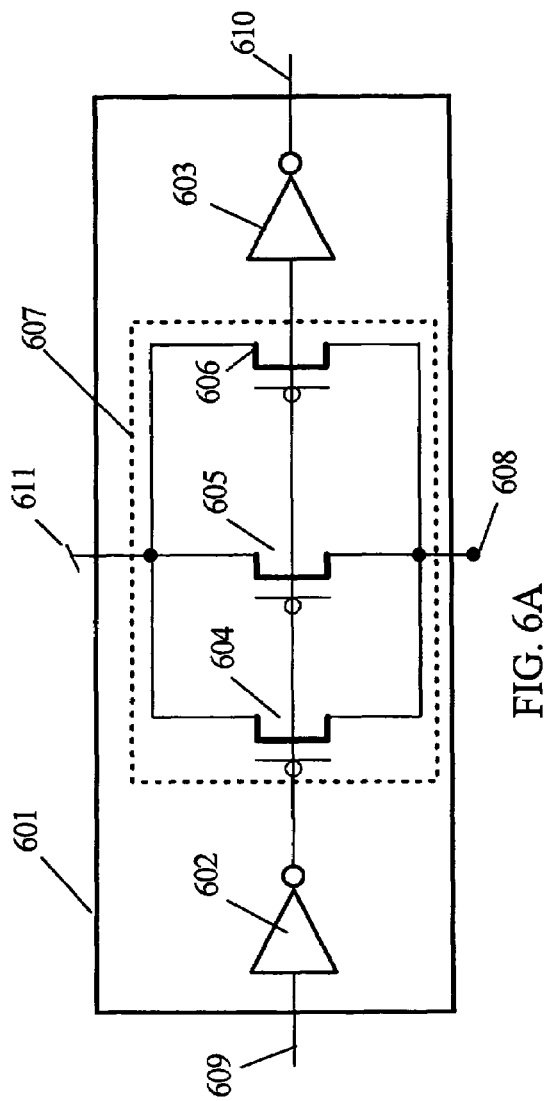
FIG. 6A is a circuit block diagram illustrating another virtual positive voltage rail cell configured according to embodiments of the present invention.

FIG. 6A is a circuit diagram of another virtual positive voltage rail cell (VPRC) 601 according to an embodiment of the present invention. VPRC 601 has a power-gating block (PGB) 607 and non-power-gated inverters 602 and 603.

Inverters 602 and 603 are not coupled directly in series as was the case in VPRC 420 in FIG. 4A. VPRC 601 has a Vdd control input 609 coupled to logic inverter 602. Logic inverter 602 is coupled to the gates of PFETs 604-606 and then to logic inverter 603 which generates Vdd control output 610. PFETs 604-606 are the devices that couple and decouple Vdd 611 to the virtual ground voltage rail node (VPR) 608 in response to logic states on Vdd control output 610. PFETs 604-606 form PGB 601. In this embodiment, a logic one turns ON the PFET devices in PGB 607 as Vdd control input 609 has only one logic inversion before it is coupled to the PFETs in PGB 607. Again Vdd control output 610 extends from VPRC 601 so that multiple VPRCs may be cascaded to form multiple VPR nodes as is shown in FIG. 6B.

Figure 6B:
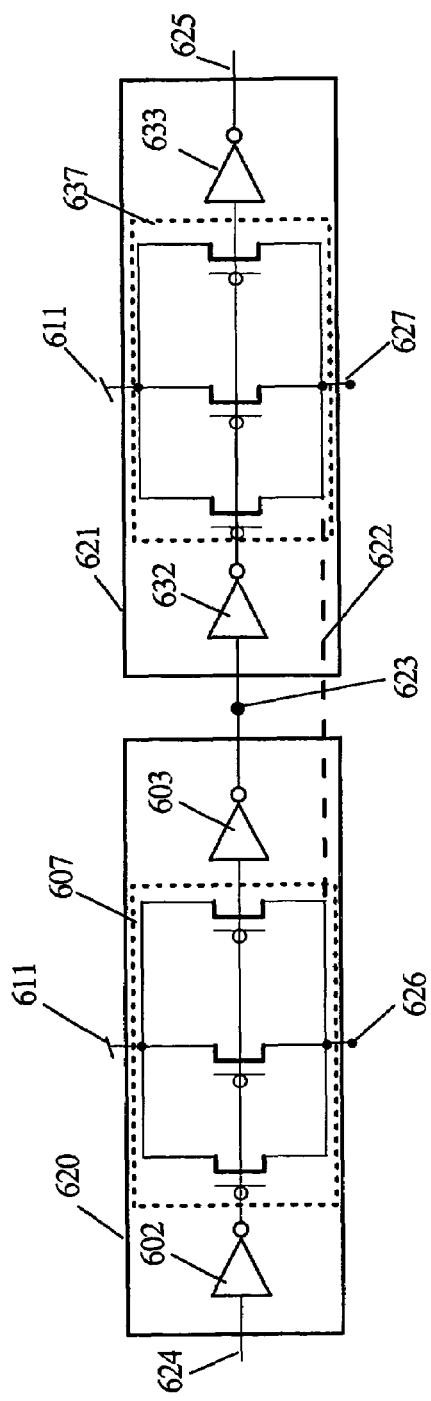
FIG. 6B is a circuit block diagram illustrating cascading two virtual positive voltage rail cells according to another embodiment of the present invention.

FIG. 6B illustrates a VPRC 620 cascaded with a VPRC 621 according to the embodiment of VPRC 601 of FIG. 6A. Vdd control input 624 is coupled to non-power-gated logic inverter 602 and its output in turn drives the gates of the PFETs in PGB 607. The gates of the PFETs in PGB 607 are also coupled to the input of non-power-gated inverter 603 which converts the Vdd control output of VPRC 620 to the same steady state phase as Vdd control input 624. The Vdd control output of VPRC 620 and the Vdd control input of VPRC 621 are coupled at node 623. In this manner Vdd control input 624 and Vdd control output 625 have the same steady state phase but again there is a delay time period for a transition on Vdd control input 624 to propagate through the logic inverters (602 and 603) and PGB 607 and 637 in both VPRC 620 and 621 respectively. Nodes VPR 626 and VPR 627 may be segmented or they may be coupled together as illustrated by dotted line 622. When Vdd control input 624 transitions to a logic zero the PFETs (e.g., 604-606) in PGB 607 in VPRC 620 turn ON first in delay sequence. When the transition to a logic zero propagates as a logic one to PGB 637 in VPRC 621, then VPR 627 is also coupled to Vdd 611 by PGB 637 but a delay time period following the turn ON of the PFETs (e.g., 604-606) of PGB 607 in VPRC 620. In this manner, a designer may time the "sleep" and "wake-up" of a VPR node powering logic devices by selecting which VPR (e.g., 626 or 627) in a sequence of VPRCs is selected for power-gating selected logic circuitry.

Figure 7A:
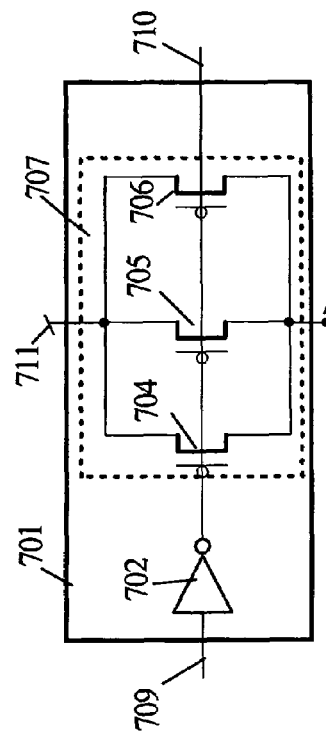
FIG. 7A is a circuit block diagram illustrating another virtual positive voltage rail cell configured according to embodiments of the present invention.

FIG. 7A is a circuit diagram of another virtual positive voltage rail cell (VPRC) 701 according to an embodiment of the present invention. VPRC 701 has a power-gating block (PGB) 707 and a single non-power-gated inverter 702. VPRC 701 has a Vdd control input 709 coupled to logic inverter 702. Logic inverter 702 is coupled to the gates of PFETs 704-706 and generates Vdd control output 710. PFETs 704-706 are the devices that couple and decouple Vdd 711 to the virtual ground voltage rail node (VPR) 708 in response to logic states on Vdd control output 710. PFETs 704-706 form PGB 701. In this embodiment, a logic one turns ON the PFET devices in PGB 707 as Vdd control input 709 has only one logic inversion before it is coupled to the PFETs in PGB 707. Vdd control output 710 extends from VPRC 701 so that a VPRC may be cascaded with a VGRC to form a VPR node and a VGR node in the same sequential control chain as is shown in FIG. 7C.

Figure 7B:
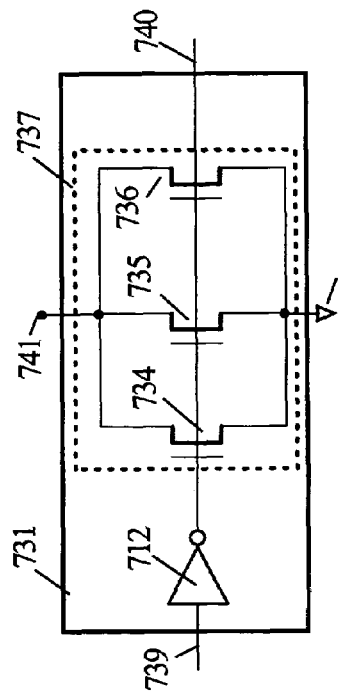
FIG. 7B is a circuit block diagram illustrating virtual ground voltage rail cell configured according to embodiments of the present invention.

FIG. 7B is a circuit diagram of another virtual ground voltage rail cell (VGRC) 701 according to an embodiment of the present invention. VGRC 701 has a power-gating block (PGB) 707 and a single non-power-gated inverters 712. VGRC 701 has a Vgnd control input 709 coupled to logic inverter 702. Logic inverter 702 is coupled to the gates of NFETs 734-736 and generates Vgnd control output 740.

NFETs 734-736 are the devices that couple and decouple Vgnd 738 to the virtual ground voltage rail node (VGR) 741 in response to logic states on Vgnd control input 739. NFETs 734-736 form PGB 737. In this embodiment, a logic zero turns ON the NFET devices in PGB 737 as Vgnd control input 739 has only one logic inversion before it is coupled to the NFETs in PGB 737. Again Vgnd control output 739 extends from VGRC 731 so that other power-gating cells may be cascaded.

Figure 7C:
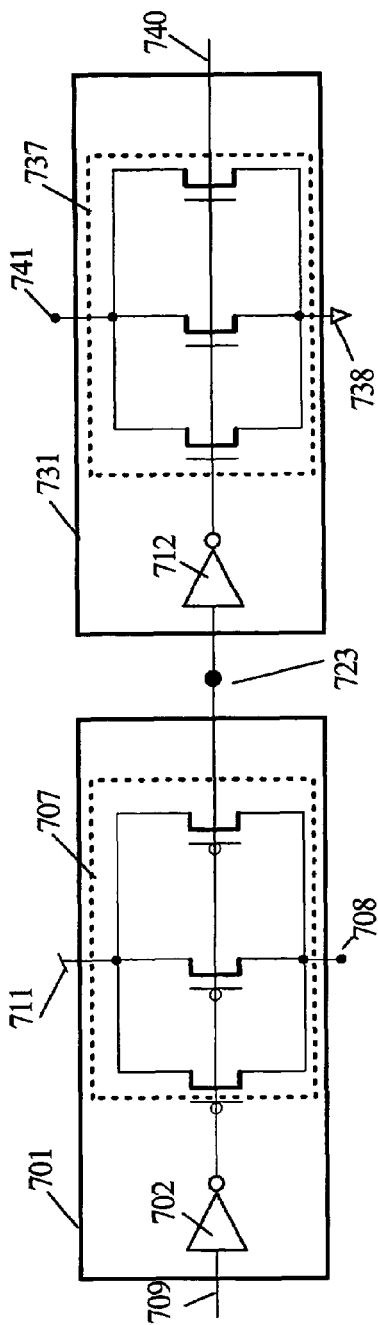
FIG. 7C is a circuit block diagram illustrating cascading a virtual positive voltage rail cell and a virtual ground voltage rail cell according to an embodiment of the present invention.

FIG. 7C illustrates a VPRC 701 cascaded with a VGRC 731 according to the embodiments FIGS. 7A and 7B. Vdd control input 709 is coupled to non-power-gated logic inverter 702 and its output in turn drives the gates of the PFETs in PGB 707. The gates of the PFETs in PGB 707 are also coupled as a Vdd control output (e.g., 710). The Vdd control output of VPRC 701 is coupled to the Vgnd control input (e.g., 740) of VGRC 731 at node 723. In this manner, Vdd control input 709 and Vgnd control output 740 have the same steady state phase but there is a delay time period for a transition on Vdd control input 709 to propagate through the logic inverters (702 and 712) and PGB 707 and 737 in both VPRC 701 and VGRC 731 respectively. When Vdd control input 709 transitions to a logic one the PFETs (e.g., 704-706) in PGB 707 in VGRC 701 turn ON first in delay sequence. When the transition to a logic one propagates as a logic one to PGB 737 in VGRC 731, then VGR 728 is also coupled to Vgnd 741 by PGB 737 but a delay time period following the turn ON of the PFETs (e.g., 704-706) of PGB 707 in VGRC 701. In this manner, a designer may time the "sleep" and "wake-up" of a VPR node and a VGR node powering logic devices by selecting VPR 708 and VGR 741 for power-gating selected logic circuitry using a common control signal (e.g. 709). Multiple of the combination VPRC and VGRC cells may be cascaded by using Vgnd control output 740 for feed another VPRC (e.g., 701).

Figure 8:
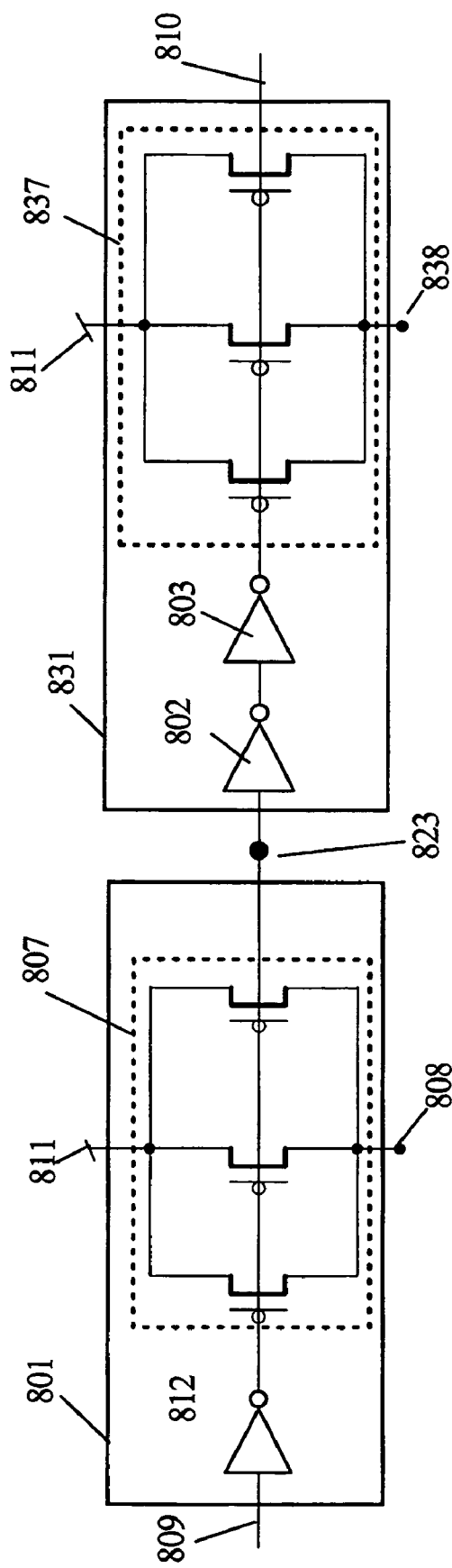
FIG. 8 is a circuit block diagram illustrating cascading an inverting virtual positive voltage rail cell and a non-inverting positive voltage rail cell according to an embodiment of the present invention.

FIG. 8 illustrates a combination of cells 800 comprising different VPRCs 801 and 831. VPRC 801 has the topology of VPRC 701 discussed in relative to FIG. 7A. VPRC 831 has the topology of the VPRC 301 discussed in relative to FIG. 3A. Combination cells 800 allows a logic one control signal applied to Vdd control input 809 to turn ON the PFET devices (e.g., 704-706) PGB 807 in a first delay sequence. The Vdd control output of VPRC 801 is coupled in phase to the gates of the PFETs (e.g., like 304-306) in PGB 807 by and likewise turns ON the PGB 837 in a second delay sequence after the first delay sequence. In this embodiment, Vdd control output 810 has a steady logic state output that is inverted from a logic state of Vdd control input 809.

Figure 9:
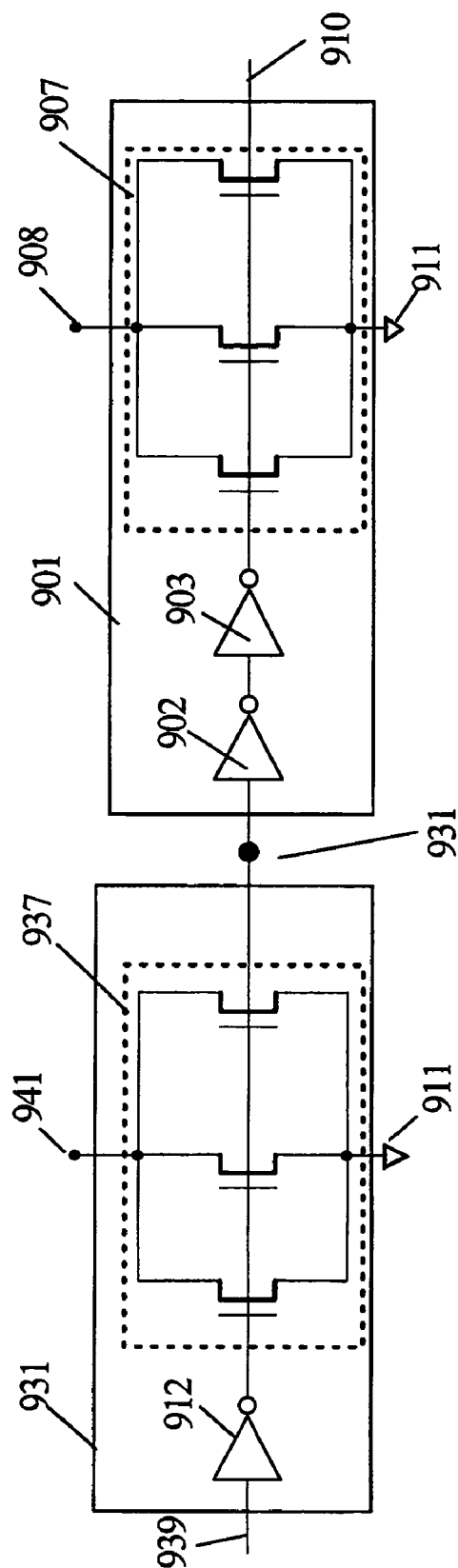
FIG. 9 is a circuit block diagram illustrating cascading an inverting virtual ground voltage rail cell and a non-inverting ground voltage rail cell according to an embodiment of the present invention.

FIG. 9 illustrates a combination of cells 900 comprising different VGRCs 901 and 931. VPRC 901 has the topology of VGRC 401 discussed in relative to FIG. 4A. VGRC 931 has the topology of the VGRC 731 discussed in relative to FIG. 7B. Combination cells 900 allows a logic one control signal applied to Vgnd control input 939 to turn ON the NFET devices (e.g., 734-736) in PGB 937 in a first delay sequence. The Vdd control output of VPRC 931 is coupled in phase to the gates of the NFETs (e.g., like 404-406) in PGB 907 by non-power-gated inverters 902 and 903 and likewise turns ON the PGB 907 in a second delay sequence after the first delay sequence. In this embodiment, Vdd control output 910 has a steady logic state output that is inverted from a logic state of Vdd control input 939.

Figure 10:
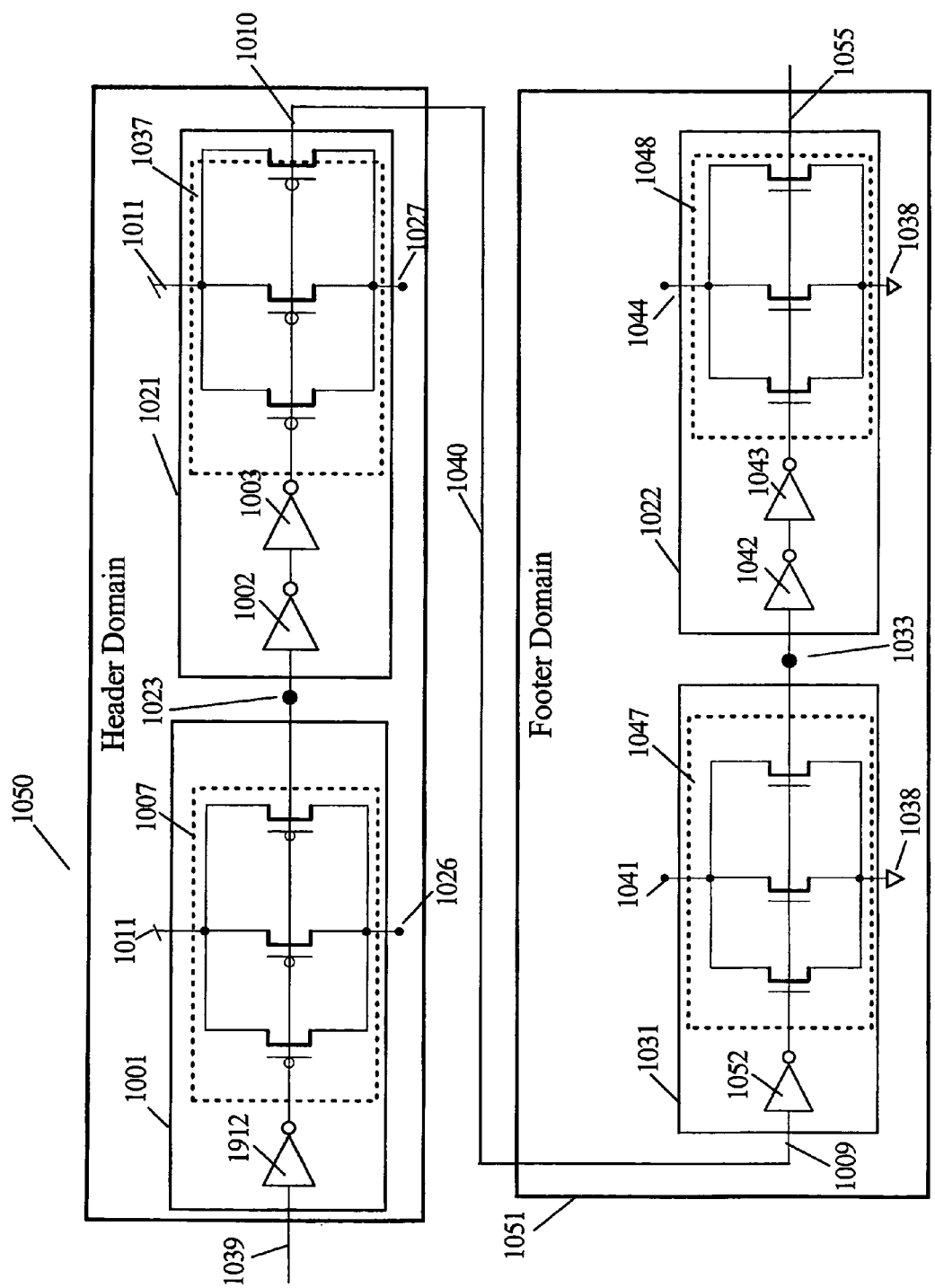
FIG. 10 illustrates coupling between a header domain and a footer domain according to embodiments of the present invention.

FIG. 10 illustrates a header domain 1050 coupled in sequence to a footer domain 1051 in a single control chain. Header domain 1050 comprises VPRC 1001 and VPRC 1021. VPRC 1001 has the topology of VPRC 701 discussed relative to FIG. 7A. VPRC 1021 has the circuit topology of VPRC 301 discussed relative to FIG. 3A. Footer domain 1051 comprises VGRC 1031 and VGRC 1022. VGRC 1031 has the circuit topology of VGRC 731 discussed relative to FIG. 7B. VGRC 1022 has the circuit topology of VGRC 401 discussed relative to FIG. 4A. A logic one on Vdd control input 1039 turns ON the PFETs of PGB 1007 via non-power-gated inverter 1012 coupling Vdd 1011 to VPR node 1026. The logic one transition propagates as a logic zero to PGB 1037 turning ON the PFETs in PGB 1037 coupling Vdd 411 to VPR node 1027. The output of non-power-gated inverter 1003 generates Vdd control output 1010 which is coupled as Vgnd control input 1009 on VGRC 1031. Vdd control output 1010 is the logic inversion of the logic states on Vdd control input 1039 by virtue of the three series logic gates 1012, 1002, and 1003. Logic gate 1052 in VGRC 1031 inverts the logic states of Vdd control input 1039 so that the logic one transition of Vdd control input 1039 is asserted as a logic one at the PGB 1037 turning ON the NFETs in PGB 1047 and coupling Vgnd 1038 to VGR node 1041. Likewise, the logic one at the PGB 1037 is propagated as a logic one via logic gates 1042 and 1043 to PGB 1048 thereby coupling Vgnd 1038 to VGR node 1044. The embodiment of FIG. 10 may be used to daisy chain header domains (e.g., 1050) and footer domains (e.g., like 1051) using the same control chain path wherein VPR nodes (e.g., 1026 and 1027) are coupled to a Vdd 1011 with timed delay sequences and VGR nodes (e.g., 1041 and 1044) are coupled to Vgnd 1038 with other timed delay sequences. FIG. 10 illustrates the variety of power-gating control that is possible using embodiments of the present invention.

Figure 11:
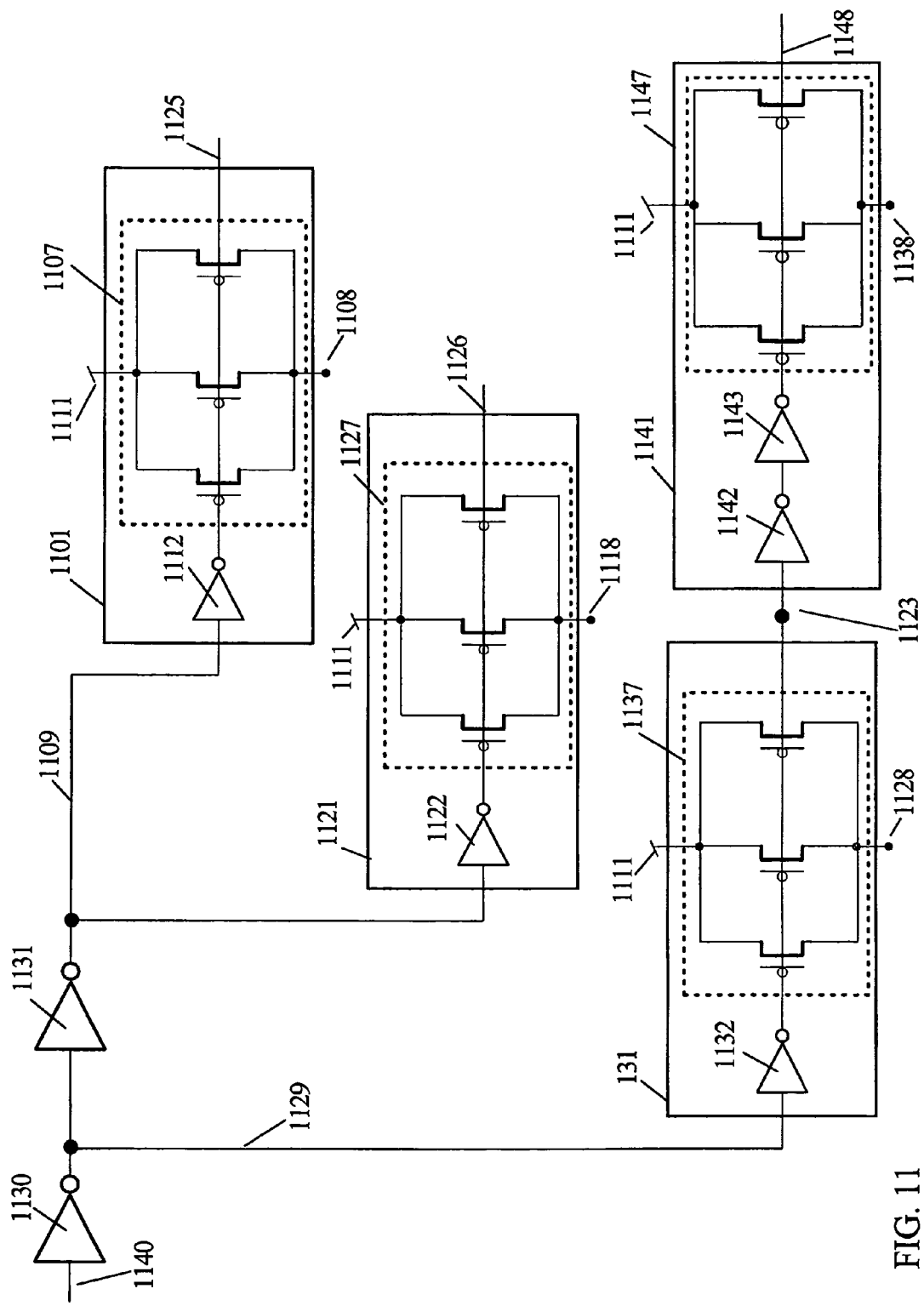
FIG. 11 illustrates multiple virtual positive voltage cells according to embodiments of the present invention.

FIG. 11 is a circuit diagram illustrates power-gating control according to another embodiment of the present invention. Multiple VPRCs 1101, 1121, 1131 and 1141 are coupled in various control chains. Vdd control input 1140 is coupled through non-power-gated inverters 1130 and 1131 to generate a three control chains controlled by inverted Vdd control input 1129 and in phase Vdd control input 1109. The first control chain comprises one or more VPRCs. In this illustration, only VPRC 1101 is shown in the first control chain, however it is understood that Vdd control output 1125 may be used to couple to additional VPRCs. VPRC 1101 has the circuit topology of VPRC 701 discussed relative to FIG. 7A. VPRC 1101 comprises a non-power-gated inverter 1112, a PGB 1107 is used to coupled Vdd 1111 to VPR node 1108. Likewise, the second control chain comprises one or more VPRCs. In this illustration, only VPRC 1121 is shown in the second control chain, however it is understood that Vdd control output 1126 may also be used to couple to additional VPRCs. VPRC 1121 also has the circuit topology of VPRC 701 discussed relative to FIG. 7A. VPRC 1121 comprises a non-power-gated inverter 1122, a PGB 1127 is used to coupled Vdd 1111 to VPR node 1118. The third control chain comprises a VPRC 1131 cascaded with VPRC 1141. VPRC 1131 has the circuit topology of VPRC 701 discussed relative to FIG. 7A and comprises non-power-gated inverter 1132, a PGB 1137 is used to coupled Vdd 1111 to VPR node 1128. Vdd control output 1126 may be used to control additional VPRCs and VGRCs according to embodiments of the present invention. VPRC 1141 has the circuit topology of VPRC 301 discussed relative to FIG. 3A and comprises non-power-gated inverters 1142 and 1143, a PGB 1147 is used to couple Vdd 1111 to VPR node 1138. The Vdd control output 1148 may be used to couple to additional VPRCs or VGRCs according to embodiments of the present invention.

Figure 12:
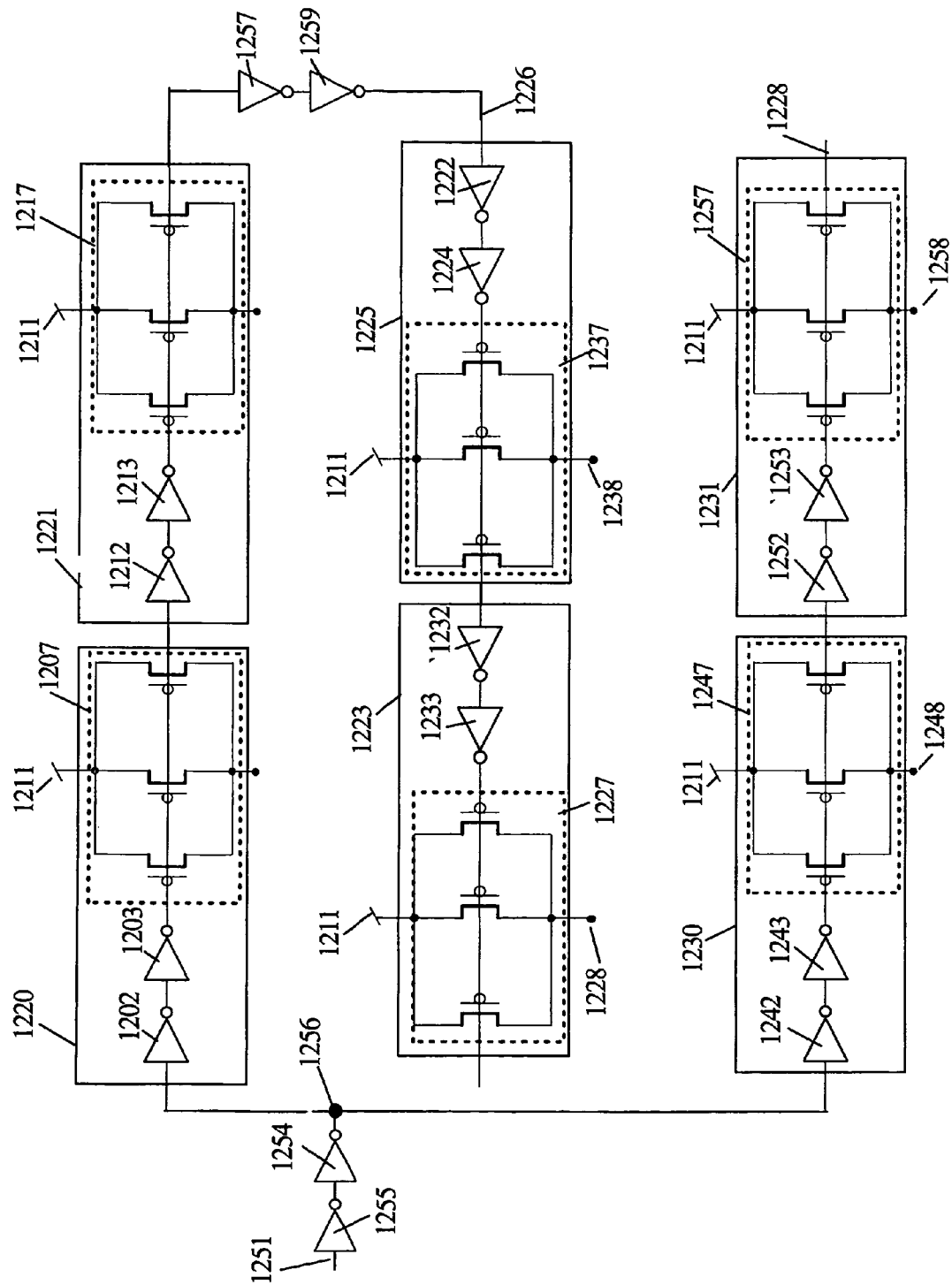
FIG. 12 is a circuit block diagram illustrating series and parallel coupled virtual positive voltage cells according to embodiments of the present invention.

FIG. 12 illustrates parallel control chains with VPRCs coupled in series and in parallel. Vdd control input 1255 is buffered to generate Vdd control input 1256 with non-power-gated inverters 1253 and 1254. Vdd control input 1256 drives one control chain comprising VPRCs 1220-1224 partitioned into two segments by inverters 1251 and 1252. VPRCs 1220-1224 have the circuit topology of VPRC 301 discussed relative to FIG. 3A. VPRCs 1220-1224 are turned ON and OFF on the same logic transitions of Vdd control input 1256, however each individual stage has its particular control signal sequentially delayed as discussed previously. Inverters 1251 and 1252 serve to buffer the propagating control signal from Vdd control input 1256 to keep the signal transition times from progressively degrading. Vdd control output 1225 is reshaped by inverters 1251 and 1252 to drive Vdd control input 1226. The second control chain comprising series coupled VPRCs 1230 and 1231. Vdd control output 1228 may be used to drive additional VPRCs (not shown). VPRC 1220 comprises non-power-gated inverters 1202 and 1203 and PGB 1207 and is used to couple Vdd 1211 to VPR node 1208. VPRC 1221 comprises non-power-gated inverters 1212 and 1213 and PGB 1217 and is used to couple Vdd 1211 to VPR node 1218. VPRC 1223 comprises non-power-gated inverters 1232 and 1233 and PGB 1227 and is used to couple Vdd 1211 to VPR node 1228. VPRC 1224 comprises non-power-gated inverters 1222 and 1224 and PGB 1237 and is used to couple Vdd 1211 to VPR node 1238. VPRC 1230 comprises non-power-gated inverters 1242 and 1243 and PGB 1227 and is used to couple Vdd 1211 to VPR node 1248. VPRC 1231 comprises non-power-gated inverters 1252 and 1253 and PGB 1237 and is used to couple Vdd 1211 to VPR node 1258.

Figure 13:
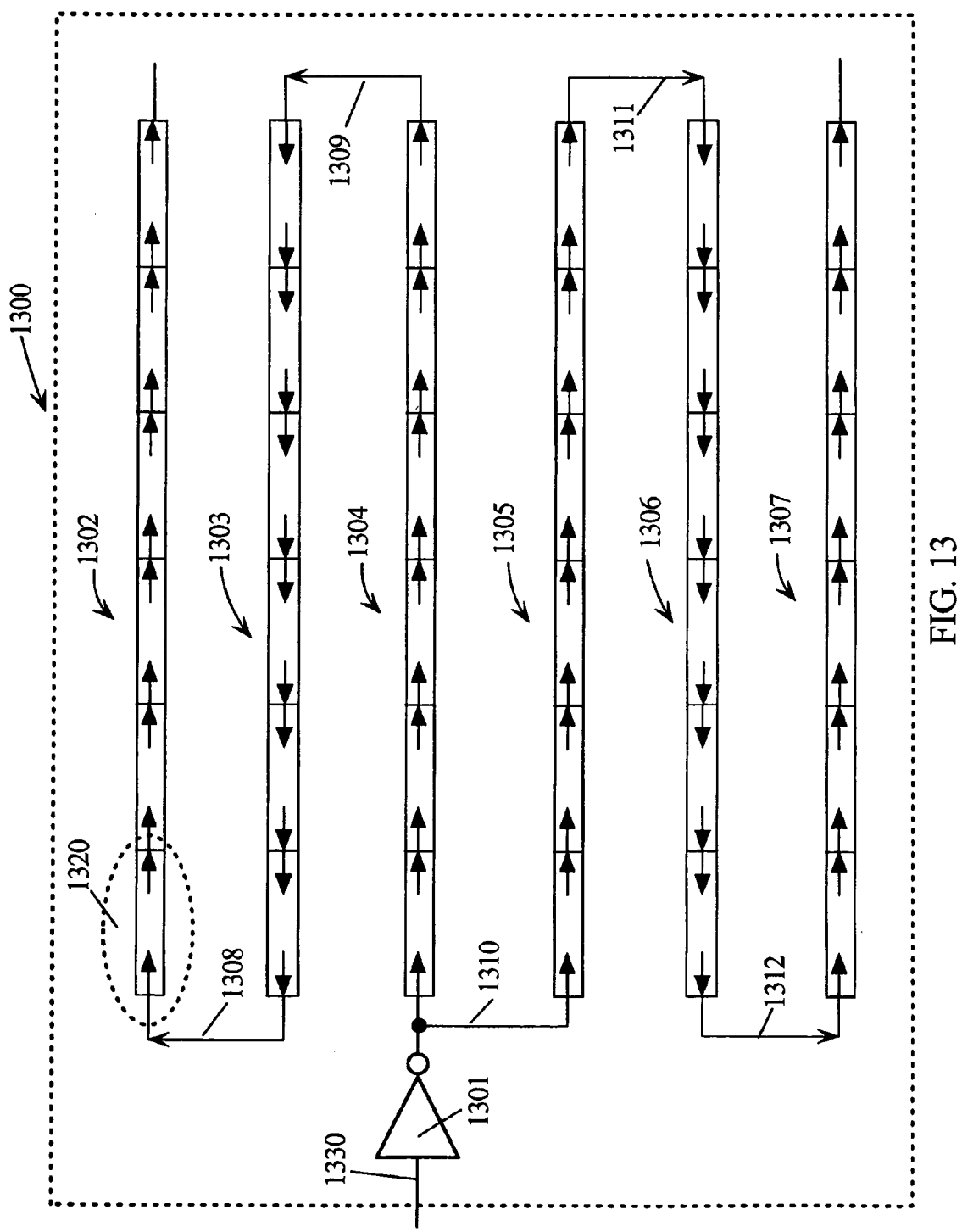
FIG. 13 is a block diagram illustrating series and parallel coupled virtual rail cells according to embodiments of the present invention.

FIG. 13 is a diagram illustrating a gated power grid 1300 of power-gated cells generating virtual rail nodes (not shown) according to embodiments of the present invention. Exemplary power-gated cell 1320 may be any one of the various power-gated cell topologies described relative to FIGS. 3A-12. The arrows in power-gated cell 1320 indicates the direction of control signal flow. Non-power-gated inverter 1301 generates a control input 1310 from a control input 1330. Control input 1310 drives two parallel control chains. The first control chain comprises sub-chains 1302-1304 coupled at nodes 1308 and 1309 and the second control chain comprises sub-chains 1305-1307 coupled at nodes 1311 and 1312.

Figure 14:
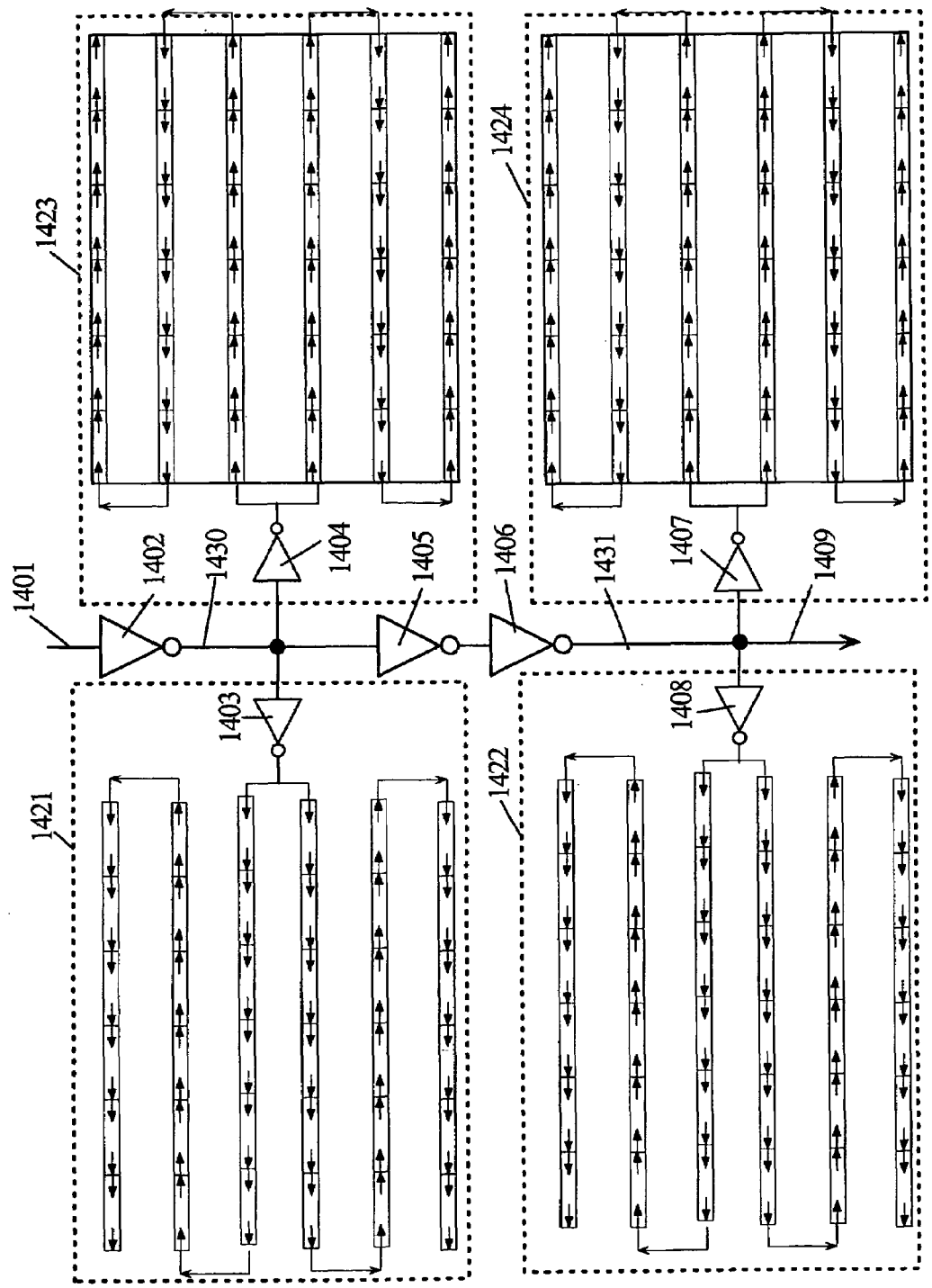
FIG. 14 is a block diagram illustrating control signals for driving multiple series and parallel coupled virtual rail cells according to embodiments of the present invention.

FIG. 14 illustrates coupling four gated power grids 1421-1424. Each grid has the same topology discussed relative to gated power grid 1300 in FIG. 13. A control input 1401 is coupled through an inverter 1402 to node 1430 driving gated power grids 1421 and 1423. The control signal at node 1430 is buffered with inverters 1405-1406 coupling the control signal to node 1431. Node 1431 drives gated power grids 1422 and 1424.

Figure 15:
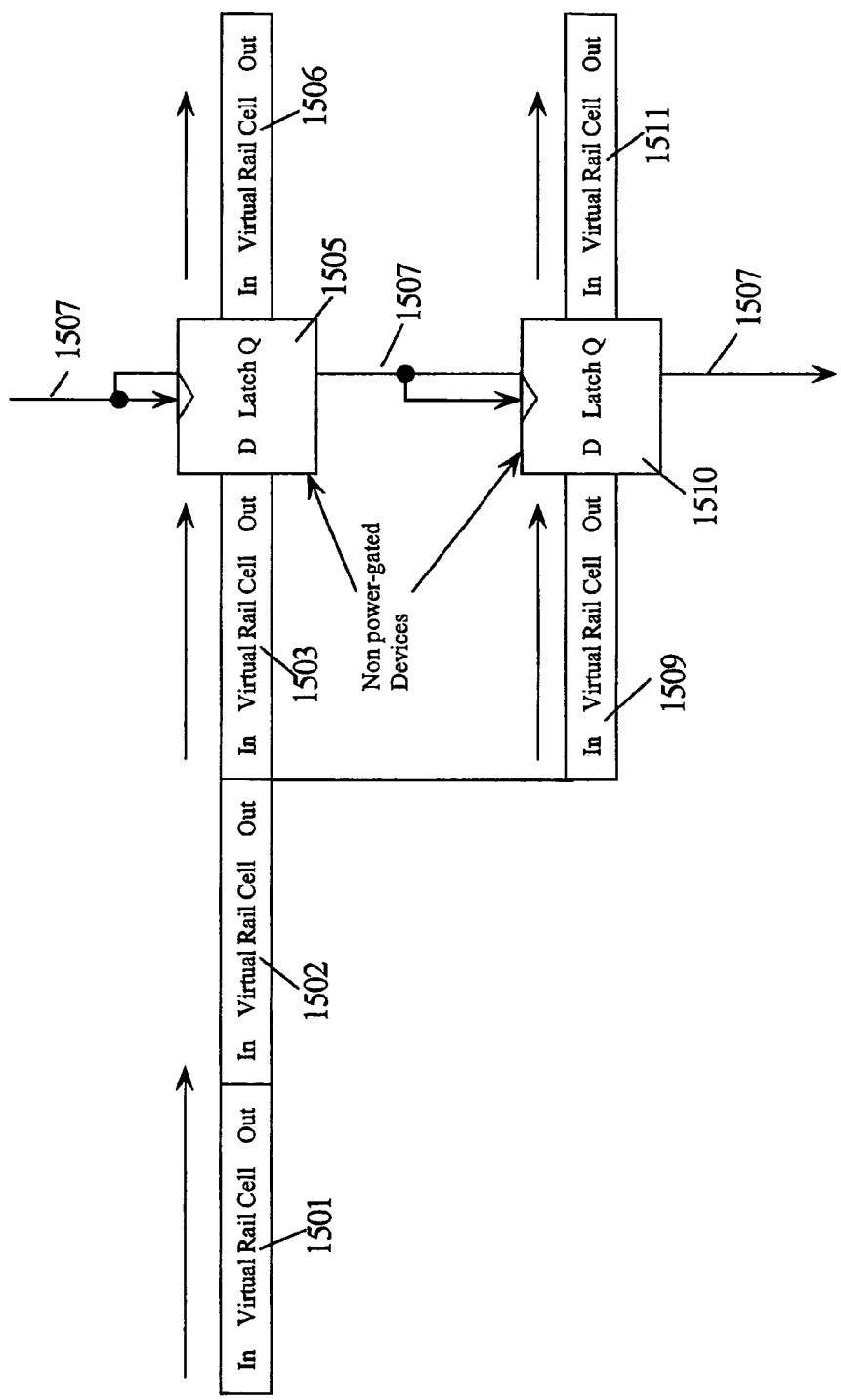
FIG. 15 is a block diagram illustrating series and parallel virtual rail cells with non-power-gated latching of control signals.

FIG. 15 is a diagram illustrating coupling virtual rail cells (e.g., VPRC and VGRC) according to another embodiment of the present invention. Three series coupled virtual rail cells 1501-1503 are coupled to non-power-gated D-latch 1505. The control output of virtual rail cell 1503 is coupled to the D-input of D-latch 1505 which is clocked with clock 1507. This allows a control signal propagated to the control output of virtual rail cell 1503 to be clocked (with clock 1507) into D-latch 1505 whose output drives the control input of virtual rail cell 1506. Likewise the control output of virtual rail cell 1502 is coupled to the control input of virtual rail cell 1509 whose control output is coupled to non-power-gated D-latch 1510. The control signal on the control output of virtual rail cell 1509 is also clocked (with clock 1507) into D-latch 1510 whose output drives the control input of virtual rail cell 1506. This configuration of power-gated cells according to embodiments of the present invention allows a designer to synchronize power-gating of selected logic circuits using a clock signal.

Figure 16:
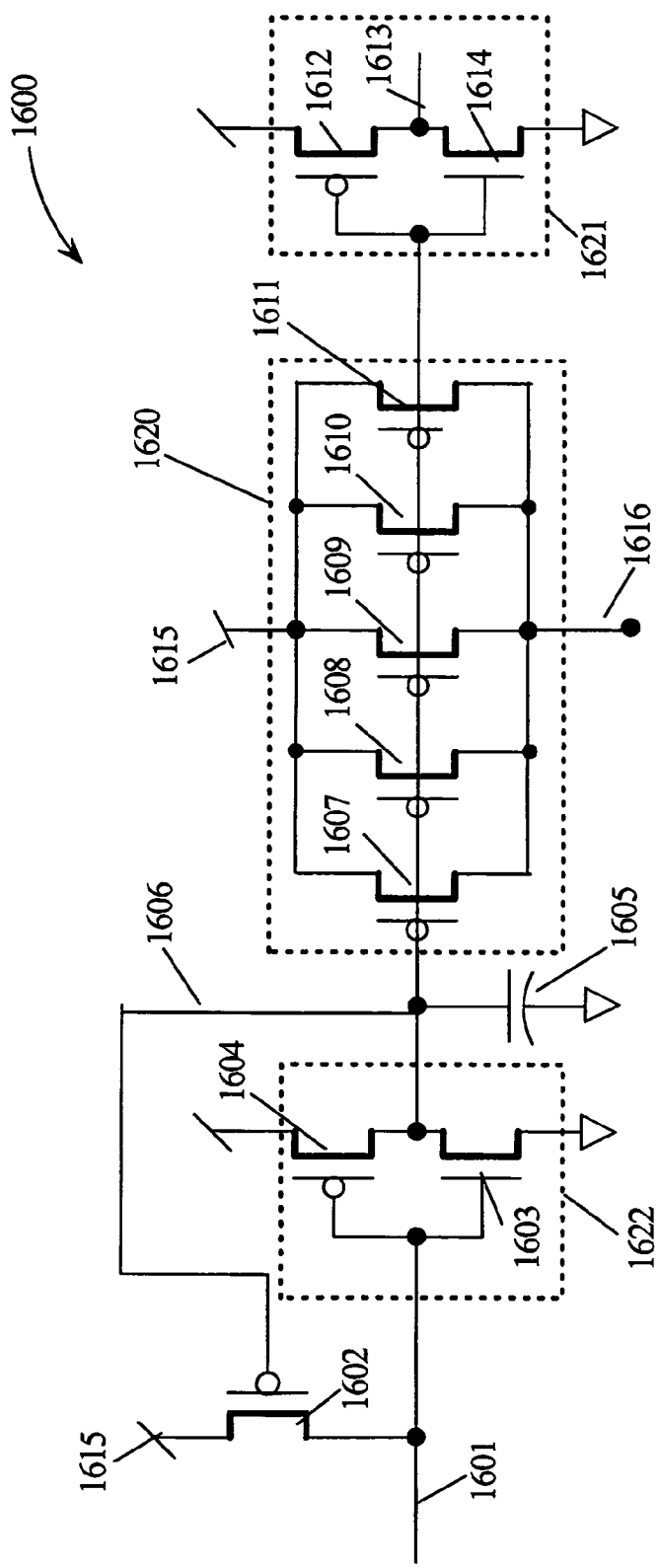
FIG. 16 is a circuit diagram of a virtual positive voltage cell with a keeper circuit for latching the control signal.

FIG. 16 is a circuit diagram of a VPRC according to another embodiment of the present invention. Vdd control input 1601 is buffered with inverter 1622 comprising PFET 1604 and NFET 1603. The output of inverter 1622 drives at the input of PGB 1620 comprising parallel coupled PFETs 1607-1610. The output of PGB 1620 is coupled to buffer inverter 1621 comprising PFET 1612 and NFET 1614 which generates Vdd control output 1613. The PFETs (1607-1611) are turned ON in delay sequence when node 1606 transitions to a logic zero in response to a logic one transition on Vdd control input 1601. When node 1606 transitions to a logic zero keeper PFET 1602 turns ON and enhances the drive of the logic one at Vdd control input 1601. This latching functions allows a logic one pulse signal arriving at Vdd control input to latch ON PGB 1620 coupling Vdd 1615 to VPR node 1616.

Figure 17:
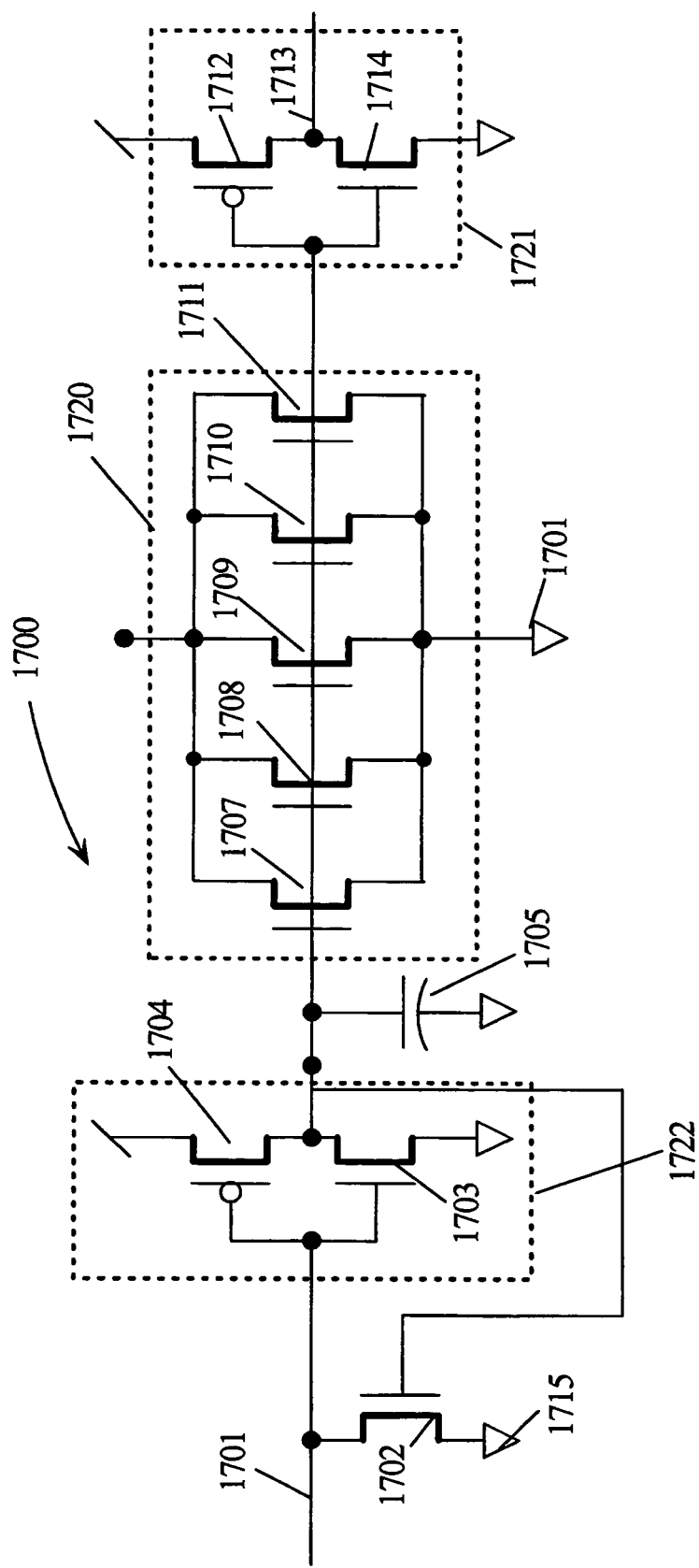
FIG. 17 is a circuit diagram of a virtual ground voltage cell with a keeper circuit for latching the control signal.

FIG. 17 is a circuit diagram of a VGRC according to another embodiment of the present invention. Vgnd control input 1701 is buffered with inverter 1722 comprising PFET 1704 and NFET 1703. The output of inverter 1722 drives the input of PGB 1720 comprising parallel coupled PFETs 1707-1710. The output of PGB 1720 is coupled to buffer inverter 1721 comprising PFET 1712 and NFET 1714 which generates Vgnd control output 1713. The PFETs (1707-1710) are turned ON in delay sequence when node 1706 transitions to a logic zero in response to a logic one transition on Vgnd control input 1701. When node 1706 transitions to a logic zero keeper NFET 1702 turns ON and enhances the drive of the logic one at Vgnd control input 1701. This latching functions allows a logic one pulse signal arriving at Vgnd control input to latch ON PGB 1720 coupling Vgnd 1715 to VGR node 1716.

Figure 18:
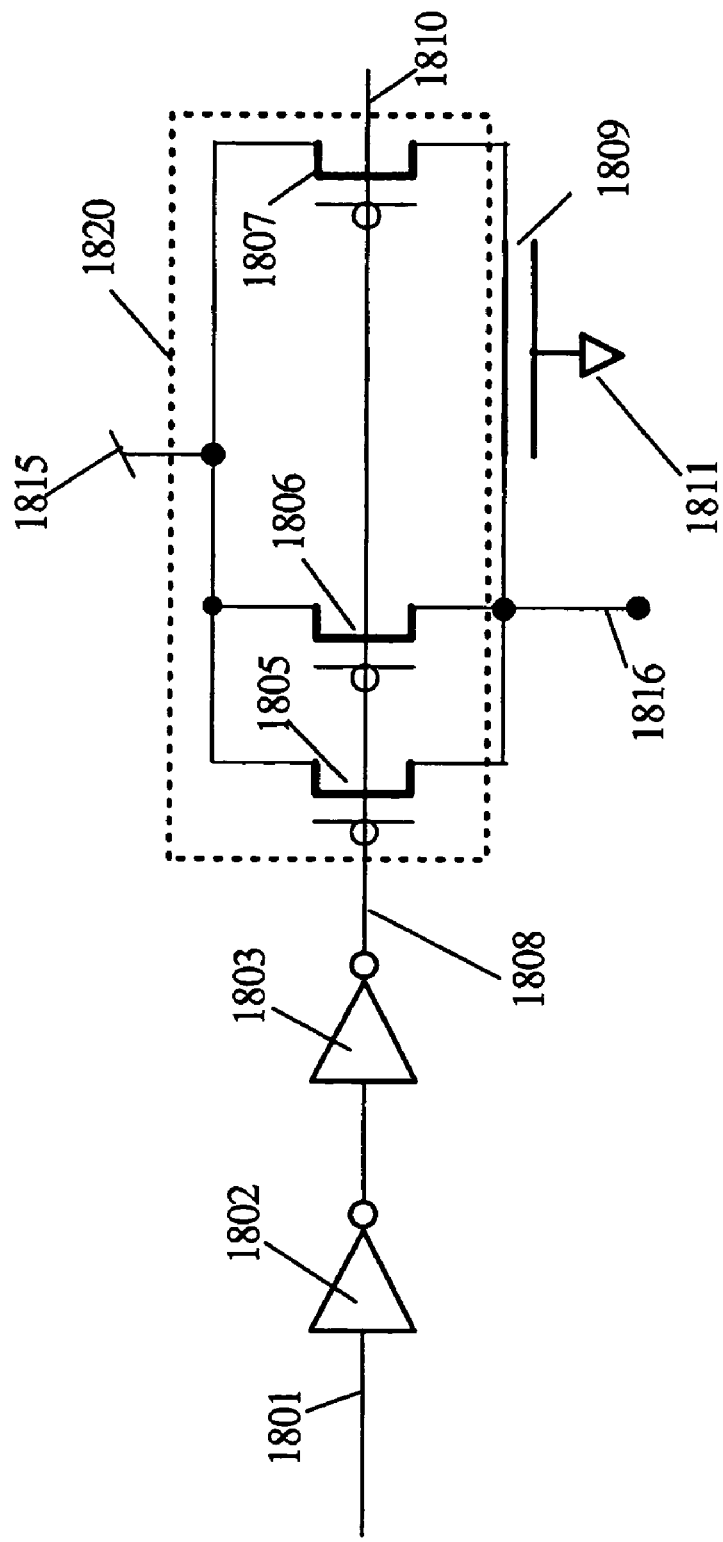
FIG. 18 is a circuit diagram of a virtual positive voltage cell with a distributed decoupling capacitance.

FIG. 18 is a circuit diagram of another embodiment of the present invention. Vdd control input 1801 is buffered with non-power-gated inverters 1802 and 1803 and couple a control signal on Vdd control input 1801 to PGB 1820 comprising PFETs 1805-1807. A logic zero transition on Vdd control input 1801 turns ON PGB 1820 thereby coupling Vdd 1815 to VPR node 1816. In this embodiment, VPR node 1816 has a distributed diffusion decoupling capacitance 1809 referenced to ground voltage potential Vgnd 1811.

Figure 19:
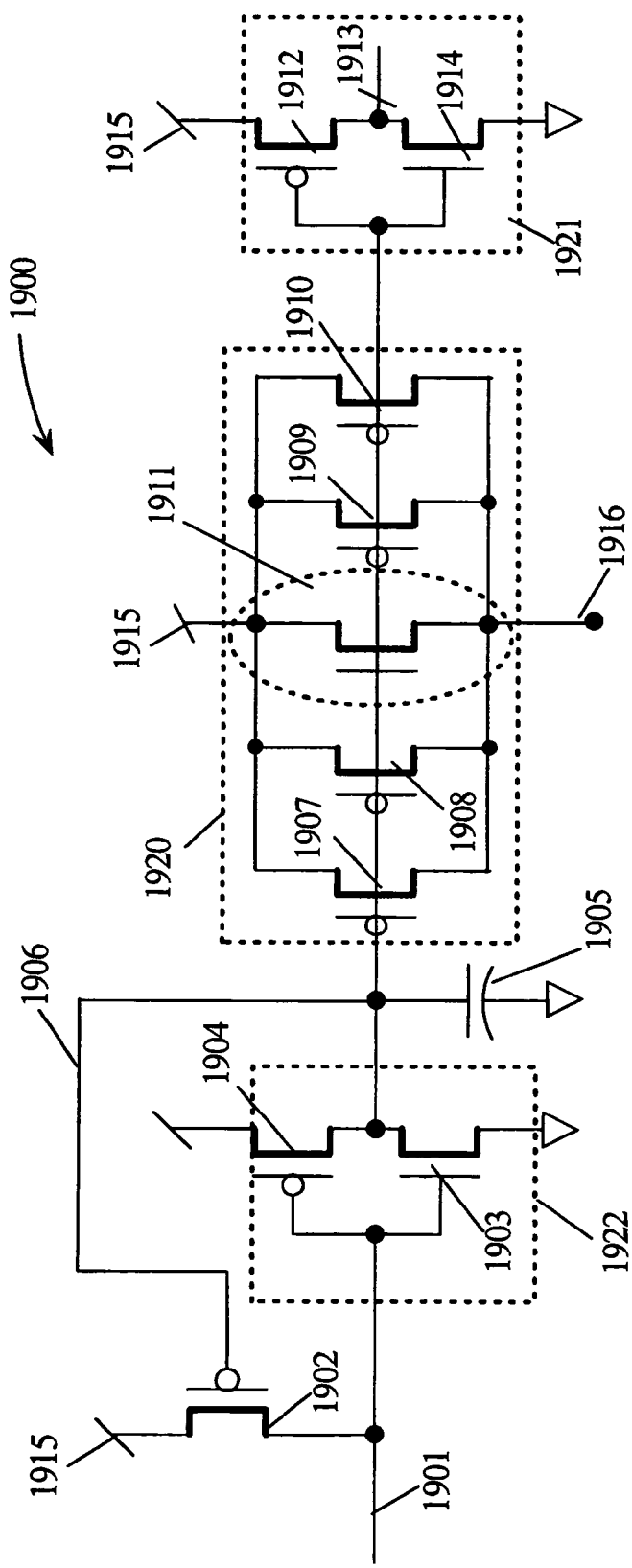
FIG. 19 is a circuit diagram of a virtual positive voltage cell with a keeper circuit for latching the control signal.

FIG. 19 is a circuit diagram of a VPRC according to another embodiment of the present invention. Vdd control input 1901 is buffered with inverter 1922 comprising PFET 1904 and NFET 1903. The output of inverter 1922 drives the input of PGB 1920 comprising parallel coupled PFETs 1907-1910 and NFET 1911. The output of PGB 1920 is coupled to buffer inverter 1921 comprising PFET 1912 and NFET 1914 which generates Vdd control output 1913. The PFETs (1907-1910) are turned ON in delay sequence when node 1906 transitions to a logic zero in response to a logic one transition on Vdd control input 1901. When node 1906 transitions to a logic zero keeper PFET 1902 turns ON and enhances the drive of the logic one at Vdd control input 1901. This latching functions allows a logic one pulse signal arriving at Vdd control input to latch ON PGB 1920 coupling Vdd 1915 to VPR node 1916. With the addition of NFET 1911, when the input to PGB 1920 transitions to a logic one, NFET 1911 will turn ON and cause VPR node 1916 to have a potential a threshold voltage (Vt) below the voltage potential of Vdd 1915.

Figure 20:
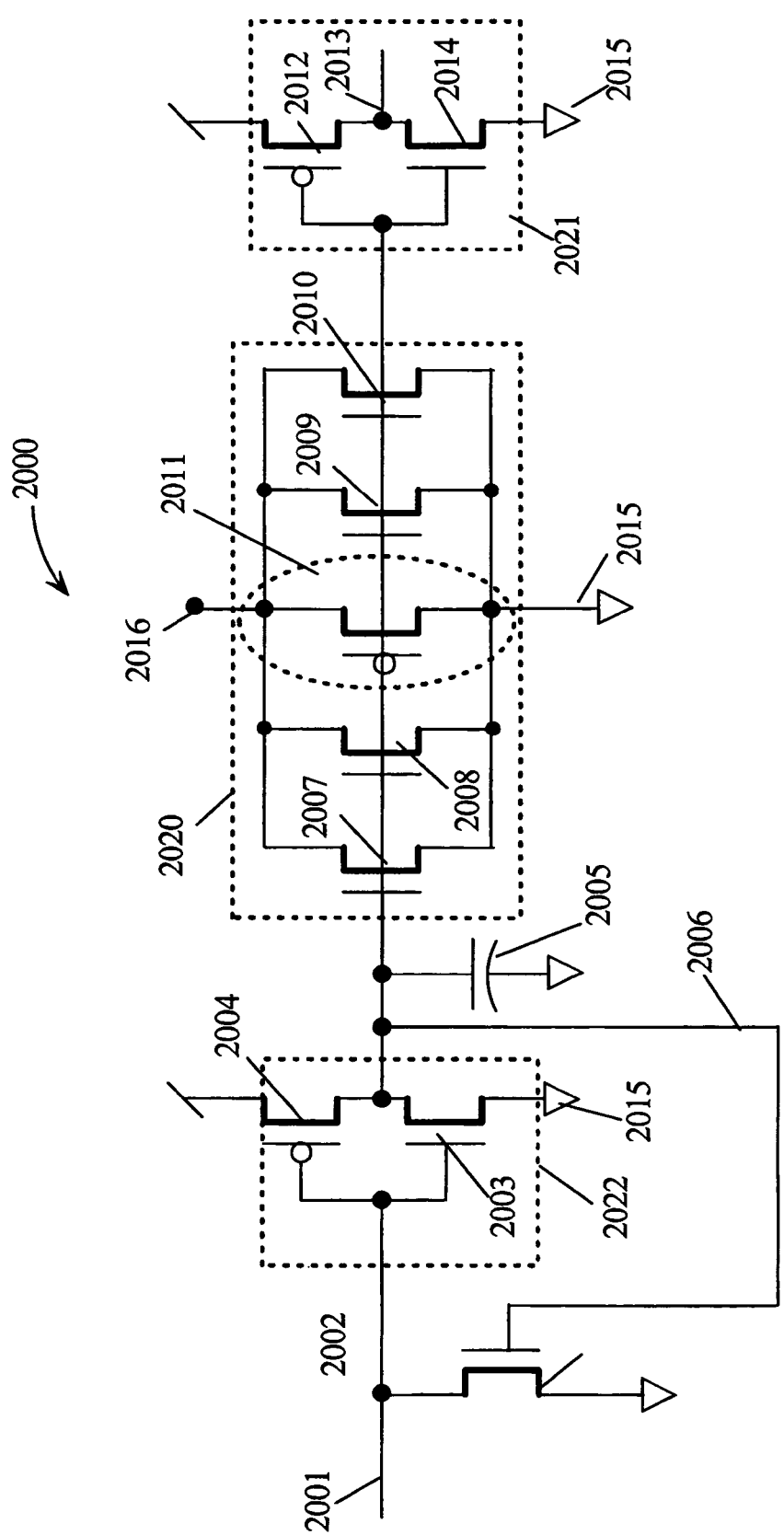
FIG. 20 is a circuit diagram of a virtual ground voltage cell with a keeper circuit for latching the control signal.

FIG. 20 is a circuit diagram of a VGRC according to another embodiment of the present invention. Vgnd control input 2001 is buffered with inverter 2022 comprising PFET 2004 and NFET 2003. The output of inverter 2022 drives the input of PGB 2020 comprising parallel coupled PFETs 2007-2010 and NFET 2011. The output of PGB 2020 is coupled to buffer inverter 2021 comprising PFET 2012 and NFET 2014 which generates Vgnd control output 2013. The PFETs (2007-2010) are turned ON in delay sequence when node 2006 transitions to a logic zero in response to a logic one transition on Vgnd control input 2001. When node 2006 transitions to a logic zero keeper NFET 2002 turns ON and enhances the drive of the logic one at Vgnd control input 2001. This latching functions allows a logic one pulse signal arriving at Vgnd control input to latch ON PGB 2020 coupling Vgnd 2015 to VGR node 2016. With the addition of PFET 2011, when the input to PGB 2020 transitions to a logic zero, PFET 2011 will turn ON and causes VGR node 2016 to have a potential a threshold voltage (Vt) higher the voltage potential of Vgnd 2015.

Figure 21:
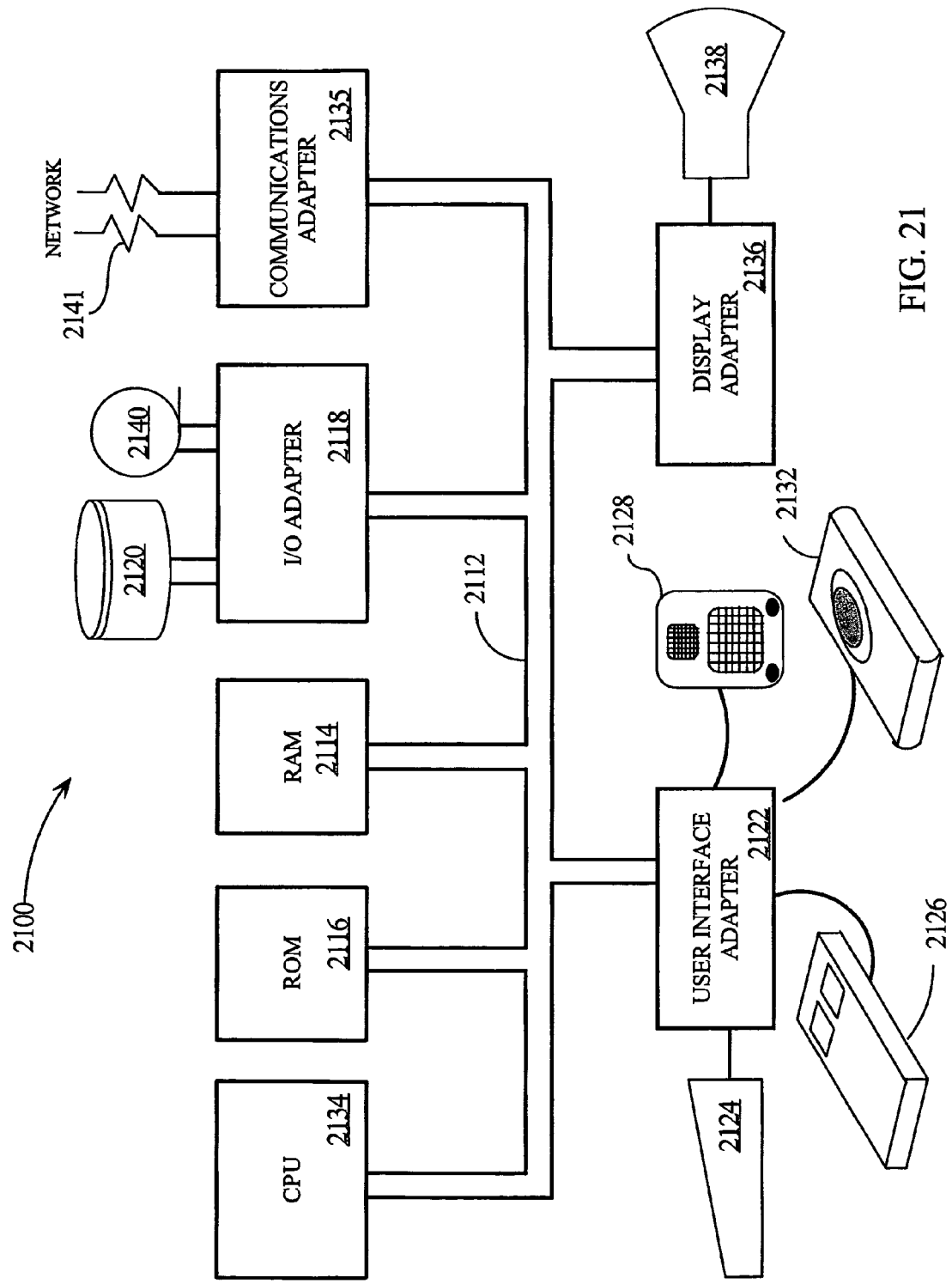
FIG. 21 is a data processing system suitable for practicing embodiments of the present invention.

FIG. 21 is a high level functional block diagram of a representative data processing system 2100 suitable for practicing the principles of the present invention. Data processing system 2100 includes a central processing system (CPU) 2110 operating in conjunction with a system bus 2112. System bus 2112 operates in accordance with a standard bus protocol, such as the ISA protocol, compatible with CPU 2110. CPU 2110 operates in conjunction with electronically erasable programmable read-only memory (EEPROM) 2116 and random access memory (RAM) 2114. Among other things, EEPROM 2116 supports storage of the Basic Input Output System (BIOS) data and recovery code. RAM 2114 includes DRAM (Dynamic Random Access Memory) system memory and SRAM (Static Random Access Memory) external cache. I/O Adapter 2118 allows for an interconnection between the devices on system bus 2112 and external peripherals, such as mass storage devices (e.g., a hard drive, floppy drive or CD/ROM drive), or a printer 2140. A peripheral device 2120 is, for example, coupled to a peripheral control interface (PCI) bus, and I/O adapter 2118 therefore may be a PCI bus bridge. User interface adapter 2122 couples various user input devices, such as a keyboard 2124 or mouse 2126 to the processing devices on bus 2112. Display 2138 which may be, for example, a cathode ray tube (CRT), liquid crystal display (LCD) or similar conventional display units. Display adapter 2136 may include, among other things, a conventional display controller and frame buffer memory. Data processing system 2100 may be selectively coupled to a computer or telecommunications network 2141 through communications adapter 2134. Communications adapter 2134 may include, for example, a modem for connection to a telecom network and/or hardware and software for connecting to a computer network such as a local area network (LAN) or a wide area network (WAN). CPU 2110 and other components of data processing system 2100 may contain circuitry for managing leakage current according to embodiments of the present invention.

What is claimed is:

1. An integrated power-gating cell comprising:
 a power node coupled to a voltage potential of a power supply;
 a power-gated node for selectively controlling power to logic circuitry in response to a control signal;
 a control output for propagating a cascading control signal;
 a non-power-gated control circuit having a control input receiving the control signal and a buffered control output and wherein the non-power-gated control circuit comprises an inverting logic circuit;
a plurality of sequentially distributed, parallel coupled switches each having a first node coupled to the power node, a second node coupled to the power-gated node, and a gating node coupled to the buffered control output, wherein the power-gated node is coupled to and decoupled from the power node as the plurality of switches are sequentially turned ON and OFF in response to propagating logic states on the gating node and the propagating logic states are coupled to generate the cascading control signal;
a latching keeper device having an input coupled to the buffered control output and an output coupled to the control input; and
a capacitor coupled from the buffered control output to a ground potential voltage of the power supply.

2. The integrated power-gating cell of claim 1, wherein the non-power-gated control circuit comprises a non-inverting logic circuit.

3. The integrated power-gating cell of claim 1, wherein the gating node is coupled to an input of an inverting logic circuit and an output of the inverting logic circuit is coupled as the control output.

4. The integrated power-gating cell of claim 1 wherein the gating node is coupled as the control output.

5. The integrated power-gating cell of claim 2, wherein the gating node is coupled as the control output.

6. The integrated power-gating cell of claim 1, wherein the power node is coupled to a positive voltage potential of a power supply and the switches are P channel field effect transistors (PFETs).

7. The integrated power-gating cell of claim 1, wherein the power node is coupled to a ground voltage potential of a power supply and the switches are N channel field effect transistors (NFETs).

8. An integrated power-gating cell comprising:
a power node coupled to a voltage potential of a power supply;
a power-gated node for selectively controlling power to logic circuitry in response to a control signal;
a control output for propagating a cascading control signal;
a non-power-gated control circuit having a control input receiving the control signal and a buffered control output;
a plurality of sequentially distributed, parallel coupled switches each having a first node coupled to the power node, a second node coupled to the power-gated node, and a gating node coupled to the buffered control output, wherein the power-gated node is coupled to and decoupled from the power node as the plurality of switches are sequentially turned ON and OFF in response to propagating logic states on the gating node and the propagating logic states are coupled to generate the cascading control signal; and
a distributed capacitance coupled from the power-gated node to a ground potential voltage of the power supply.

9. An integrated circuit (IC) having a first power supply chain comprising a plurality of power-gating cells each of the power-gating cells having a power node coupled to a voltage potential of a power supply, a power-gated node for selectively controlling power to logic circuitry in response to a control signal, a control output for propagating a cascading control signal, a non-power-gated control circuit having a control input receiving the control signal and generating a buffered control output, and a plurality of sequentially distributed, parallel coupled switches each having a first node coupled to the power node, a second node coupled to the power-gated node, and a gating node coupled to the buffered control output, wherein the power-gated node is coupled to and decoupled from the power node as the plurality of switches are sequentially turned ON and OFF in response to propagating logic states on the gating node and the propagating logic states are coupled to generate the cascading control signal, wherein the plurality of power-gating cells comprises first and second power-gating cells coupled in series with the control output of the first power-gating cell coupled to the control input of the second power-gating cell, and wherein the control output of the first power-gating cell is coupled to the control input of the second power-gating cell via a latching circuit and a logic state of the control output of the first power-gating cell is coupled to the control input of the second power-gating cell in response to a clock signal coupled to the latching circuit.

10. The IC of claim 9, further comprising a second power supply chain comprising a plurality of power-gating cells each of the power-gating cells having a power node coupled to a voltage potential of a power supply, a power-gated node for selectively controlling power to logic circuitry in response to a control signal, a control output for propagating a cascading control signal, a non-power-gated control circuit having a control input receiving the control signal and generating a buffered control output, and a plurality of sequentially distributed, parallel coupled switches each having a first node coupled to the power node, a second node coupled to the power-gated node, and a gating node coupled to the buffered control output, wherein the power-gated node is coupled to and decoupled from the power node as the plurality of switches are sequentially turned ON and OFF in response to propagating logic states on the gating node and the propagating logic states are coupled to generate the cascading control signal.

11. The IC of claim 10, wherein the plurality of power-gating cells of the second power supply chain comprises third and fourth power-gating cells coupled in series with the control output of the third power-gating cell coupled to the control input of the fourth power-gating cell.

12. The IC of claim 11, wherein the power nodes of the power-gating cells of the first power supply chain are coupled to a positive voltage potential of the power supply and the switches are P channel field effect transistors (PFETs).

13. The IC of claim 12, wherein the power nodes of the power-gating cells of the second power supply chain are coupled to the positive voltage potential of the power supply and the switches are P channel field effect transistors (PFETs).

14. The IC of claim 12, wherein the power nodes of the power-gating cells of the second power supply chain are coupled to a ground voltage potential of the power supply and the switches are N channel field effect transistors (NFETs).

15. The IC of claim 10 further comprising:
a plurality of the first power supply chains coupled in series forming a first power grid branch with power nodes of the first power supply chains coupled to a positive voltage potential of the power supply, wherein the first power supply chains are coupled to a first control signal; and
a plurality of the second power supply chains coupled in series forming a second power grid branch with power nodes of the second power supply chains coupled to a ground voltage potential of the power supply, wherein the second power supply chains are coupled to the first control signal.

16. A data processing system comprising:

a central processing unit (CPU) as one or more integrated circuits each having a first power supply chain comprising a plurality of power-gating cells each of the power-gating cells having a power node coupled to a voltage potential of a power supply, a power-gated node for selectively controlling power to logic circuitry in response to a control signal, a control output for propagating a cascading control signal, a non-power-gated control circuit having a control input receiving the control signal and generating a buffered control output, and wherein the non-power-gated control circuit comprises an inverting logic circuit, a plurality of sequentially distributed, parallel coupled switches each having a first node coupled to the power node, a second node coupled to the power-gated node, and a gating node coupled to the buffered control output, wherein the power-gated node is coupled to and decoupled from the power node as the plurality of switches are sequentially turned ON and OFF in response to propagating logic states on the gating node and the propagating logic states are coupled to generate the cascading control signal, a latching keeper device having an input coupled to the buffered control output and an output coupled to the control input, and a capacitor coupled from the buffered control output to a ground potential voltage of the power supply.

* * * * *